US012751131B2

(12) United States Patent
Chen et al.

(10) Patent No.: US 12,751,131 B2
(45) Date of Patent: Sep. 29, 2026

(54) ORGANIC LIGHT EMITTING DEVICE AND DISPLAY APPARATUS

(71) Applicant: BOE Technology Group Co., Ltd., Beijing (CN)

(72) Inventors: Lei Chen, Beijing (CN); Dan Wang, Beijing (CN); Rongrong Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1025 days.

(21) Appl. No.: 17/607,381

(22) PCT Filed: Dec. 11, 2020

(86) PCT No.: PCT/CN2020/135538

§ 371 (c)(1),
(2) Date: Oct. 28, 2021

(87) PCT Pub. No.: WO2022/120774

PCT Pub. Date: Jun. 16, 2022

(65) Prior Publication Data

US 2022/0376199 A1 Nov. 24, 2022

(51) Int. Cl.
*H10K 50/11* (2023.01)
*G09G 3/3233* (2016.01)
(Continued)

(52) U.S. Cl.
CPC ........... *H10K 50/11* (2023.02); *H10K 50/181* (2023.02); *H10K 85/631* (2023.02);
(Continued)

(58) Field of Classification Search
CPC .... H10K 50/11; H10K 85/631; H10K 85/633; H10K 85/636; H10K 50/15;
(Continued)

(56) References Cited

U.S. PATENT DOCUMENTS

2013/0001542 A1* 1/2013 Okajima ................ C09K 11/06 257/40
2014/0110687 A1 4/2014 Yamada et al.
(Continued)

FOREIGN PATENT DOCUMENTS

CN 103827065 A 5/2014
CN 106796996 A 5/2017
(Continued)

OTHER PUBLICATIONS

Machine Translation of WO2019107710A1 (Year: 2019).*
(Continued)

*Primary Examiner* — Jenna N Chandhok

(57) ABSTRACT

Provided are an organic light emitting device and a display apparatus. An organic light emitting device, including an anode, a cathode, and an emitting layer disposed between the anode and the cathode; wherein a hole transport layer and an electron blocking layer are disposed between the anode and the emitting layer; the hole transport layer and the electron blocking layer satisfy:

$$|HOMO_{HTL}-HOMO_{EBL}|\leq 0.2\ eV$$

wherein $HOMO_{HTL}$ is a highest occupied molecular orbital, HOMO energy level of the hole transport layer and $HOMO_{EBL}$ is a HOMO energy level of the electron blocking layer.

11 Claims, 4 Drawing Sheets

(51) Int. Cl.

| | |
|---|---|
| ***H10K 50/15*** | (2023.01) |
| ***H10K 50/18*** | (2023.01) |
| ***H10K 85/60*** | (2023.01) |
| ***H10K 101/30*** | (2023.01) |
| ***H10K 101/40*** | (2023.01) |

(52) U.S. Cl.
CPC ......... *H10K 85/633* (2023.02); *H10K 85/636* (2023.02); *G09G 3/3233* (2013.01); *G09G 2300/0426* (2013.01); *G09G 2300/0452* (2013.01); *G09G 2300/0819* (2013.01); *G09G 2300/0842* (2013.01); *G09G 2320/0626* (2013.01); *G09G 2330/021* (2013.01); *H10K 50/15* (2023.02); *H10K 85/6572* (2023.02); *H10K 2101/30* (2023.02); *H10K 2101/40* (2023.02)

(58) Field of Classification Search
CPC ........... H10K 85/6572; H10K 2101/30; H10K 2101/40; H10K 50/181
See application file for complete search history.

(56) References Cited

U.S. PATENT DOCUMENTS

| | | | | |
|---|---|---|---|---|
| 2014/0225968 | A1 | 8/2014 | Kamatani et al. | |
| 2016/0308138 | A1* | 10/2016 | Kim ....................... | H10K 50/11 |
| 2017/0141328 | A1 | 5/2017 | Hayer et al. | |
| 2019/0305050 | A1 | 10/2019 | Ishizuya et al. | |
| 2019/0305051 | A1 | 10/2019 | Takahashi et al. | |
| 2020/0048273 | A1 | 2/2020 | Park et al. | |

FOREIGN PATENT DOCUMENTS

| | | | | | |
|---|---|---|---|---|---|
| CN | 106866498 | A | | 6/2017 | |
| CN | 108440424 | A | | 8/2018 | |
| CN | 110349995 | A | | 10/2019 | |
| CN | 110349996 | A | | 10/2019 | |
| CN | 110416422 | A | | 11/2019 | |
| CN | 110818670 | A | | 2/2020 | |
| CN | 111039881 | A | | 4/2020 | |
| CN | 111454244 | A | | 7/2020 | |
| CN | 111518544 | A | | 8/2020 | |
| CN | 111533678 | A | | 8/2020 | |
| CN | 111533736 | A | | 8/2020 | |
| CN | 111662258 | A | | 9/2020 | |
| CN | 111662259 | A | | 9/2020 | |
| KR | 20150084562 | A | * | 7/2015 | ............. C09K 11/06 |
| KR | 20180012193 | A | * | 2/2018 | ......... H01L 51/5092 |
| KR | 20180060582 | A | | 6/2018 | |
| WO | WO-2013118812 | A1 | * | 8/2013 | ........... C07D 209/82 |
| WO | WO-2019107710 | A1 | * | 6/2019 | ............. C09K 11/06 |
| WO | 2020231214 | A1 | | 11/2020 | |

OTHER PUBLICATIONS

Machine Translation of WO2013118812A1 (Year: 2013).*
Machine Translation of KR20150084562A (Year: 2015).*
Machine Translation of KR20180012193A (Year: 2018).*
Sunwoo Kang et al., Unveiling the Root Cause of the Efficiency-Lifetime Trade-Off in Blue Fluorescent Organic Light-Emitting Diodes, Electronic Materials Letters, Nov. 19, 2019.

* cited by examiner

ORGANIC LIGHT EMITTING DEVICE AND DISPLAY APPARATUS

TECHNICAL FIELD

The present disclosure relates to, but is not limited to, the technical field of display, in particular to an organic light emitting device and a display apparatus.

BACKGROUND

An Organic Light Emitting Device (abbreviated as an OLED) as a new type of flat panel display is gradually receiving increasing attention. OLED is an active light emitting device, with advantages of high brightness, color saturation, ultra-thin, wide viewing angle, low power consumption, high response speed and flexibility.

OLED includes an anode, a cathode and an emitting layer disposed between the anode and the cathode. Its light-emitting principle is that holes and electrons are injected into the emitting layer from the anode and the cathode respectively. When the electrons and holes meet in the emitting layer, the electrons and holes recombine to generate excitons, and these excitons emit light while changing from excited state to ground state.

SUMMARY

The following is a summary of subject matter described in detail herein. This summary is not intended to limit the protection scope of the claims.

An organic light emitting device, the plurality of an anode, a cathode, and an emitting layer disposed between the anode and the cathode; wherein a hole transport layer and an electron blocking layer are disposed between the anode and the emitting layer; the hole transport layer and the electron blocking layer satisfy:

$$|HOMO_{HTL}-HOMO_{EBL}|\leq 0.2\text{ eV}$$

$HOMO_{HTL}$ is a highest occupied molecular orbital, HOMO energy level of the hole transport layer and $HOMO_{EBL}$ is a HOMO energy level of the electron blocking layer.

In an exemplary embodiment, the emitting layer includes a host material and a dopant material doped in the host material; the electron blocking layer and the dopant material satisfy:

$$HOMO_{dopant}\leq HOMO_{EBL}$$

$HOMO_{dopant}$ is a HOMO energy level of the dopant material.

In an exemplary embodiment, the electron blocking layer and the dopant material satisfy:

$$|LUMO_{EBL}-LUMO_{dopant}|>0.1\text{ eV}$$

$LUMO_{EBL}$ is a lowest unoccupied molecular orbital, LUMO energy level of the hole transport layer and $LUMO_{dopant}$ is a LUMO energy level of the dopant material.

In an exemplary embodiment, the electron blocking layer and the host material further satisfy:

$$|LUMO_{EBL}-LUMO_{dopant}|>0.4\text{ eV}$$

$LUMO_{EBL}$ is a lowest unoccupied molecular orbital, LUMO energy level of the hole transport layer and $LUMO_{host}$ is a LUMO energy level of the host material.

In an exemplary embodiment, the host material and the dopant material satisfy:

$$LUMO_{dopant}<LUMO_{host}$$

$LUMO_{dopant}$ is the LUMO energy level of the dopant material, and $LUMO_{host}$ is the LUMO energy level of the host material.

In an exemplary embodiment, hole mobility of the hole transport layer is greater than 10 times that of the electron blocking layer.

In an exemplary embodiment, the hole mobility of the hole transport layer is $10^{-2}$ $cm^2/Vs$ to $10^{-6}$ $cm^2/Vs$, and the hole mobility of the electron blocking layer is $10^{-4}$ $cm^2/Vs$ to $10^{-6}$ $cm^2/Vs$.

In an exemplary embodiment, the hole mobility of the electron blocking layer is greater than 100 times that of the host material.

In an exemplary embodiment, electron mobility of the host material is greater than the hole mobility of the host material.

In an exemplary embodiment, the hole mobility of the host material is $10^{-9}$ $cm^2/Vs$ to $10^{-6}$ $cm^2/Vs$; the electron mobility of the host material is $10^{-6}$ $cm^2/Vs$ to $10^{-8}$ $cm^2/Vs$; electron mobility of the dopant material is $10^{-8}$ $cm^2/Vs$ to $10^{-10}$ $cm^2/Vs$; electron mobility of the hole transport layer is less than $10^{-8}$ $cm^2/Vs$; and electron mobility of the electron blocking layer is less than $10^{-8}$ $cm^2/Vs$.

In an exemplary embodiment, a lowest triplet energy of the electron blocking layer is greater than 2.3 eV.

In an exemplary embodiment, a material of the hole transport layer includes a compound having the following structural formula:

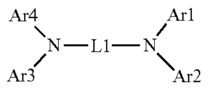

Ar1 to Ar4 are independently substituted or unsubstituted aryl groups with 6 to 30 ring carbon atoms, or substituted or unsubstituted heteroaryl groups with 5 to 20 ring atoms; L1 is a substituted or unsubstituted aryl group, heteroaryl, fluorene, dibenzofuran, or thiophene having 6 to 30 carbon atoms, or a combination thereof.

In an exemplary embodiment, a material of the hole transport layer includes one or more compounds having the following structural formulas:

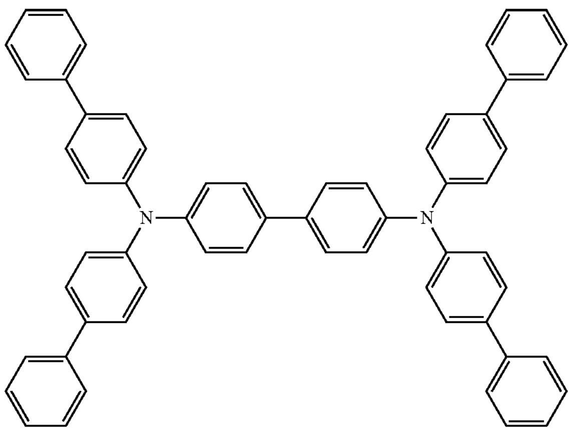

-continued
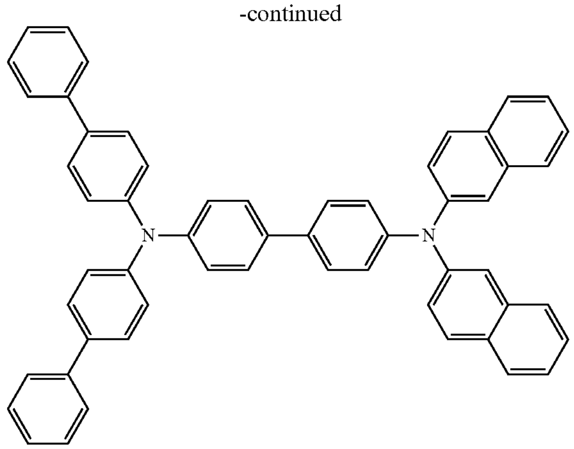
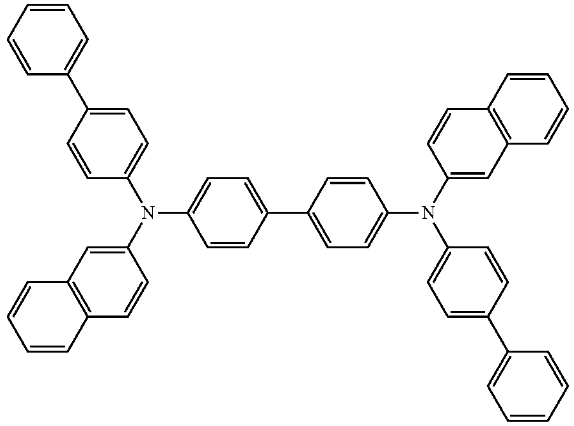
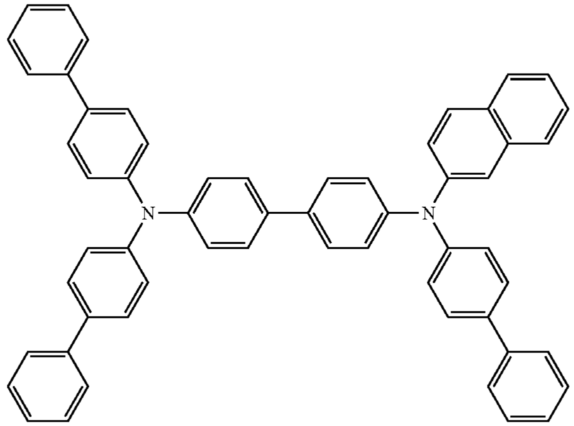
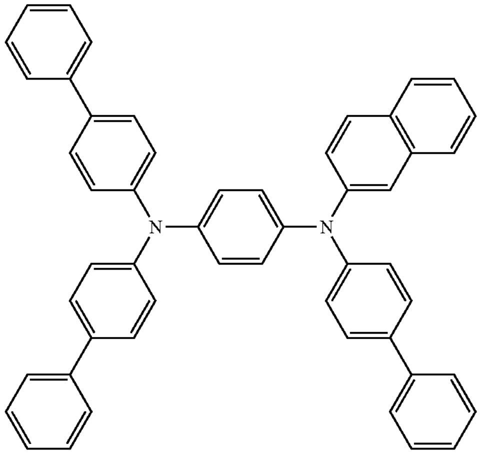
-continued
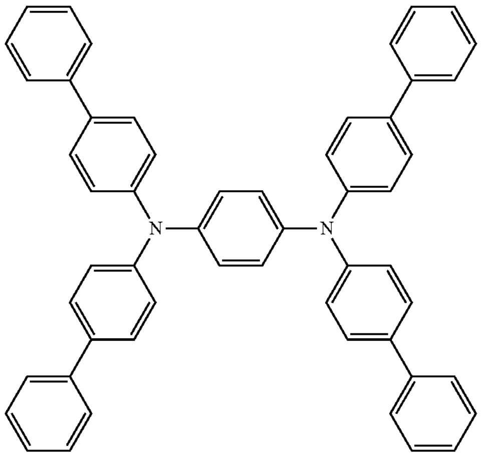
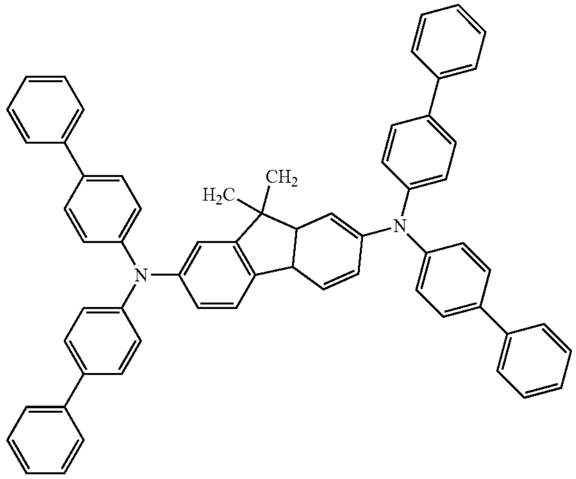
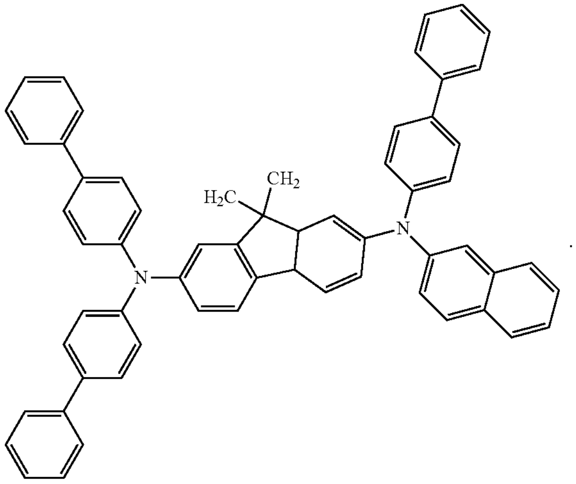

In an exemplary embodiment, a material of the electron blocking layer includes a compound having the following structural formula:

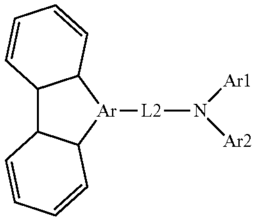

Ar1 to Ar2 are independently substituted or unsubstituted aryl groups with 6 to 30 ring carbon atoms, or substituted or unsubstituted heteroaryl groups with 5 to 20 ring atoms; L2 is a substituted or unsubstituted aryl group, heteroaryl, fluorene, dibenzofuran, or thiophene having 6 to 30 carbon atoms, or a combination thereof.

In an exemplary embodiment, a material of the electron blocking layer includes one or more of compounds having the following structural formulas:

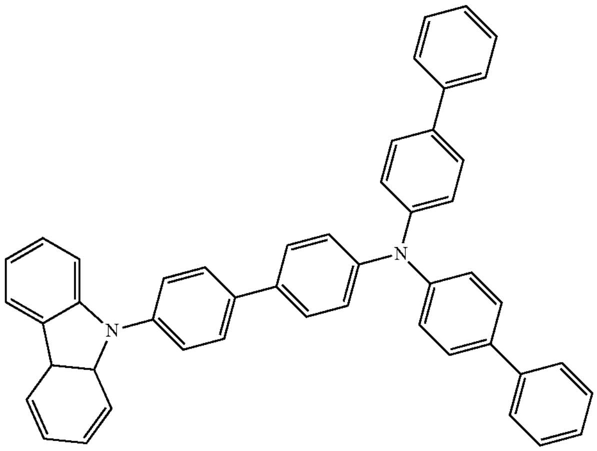

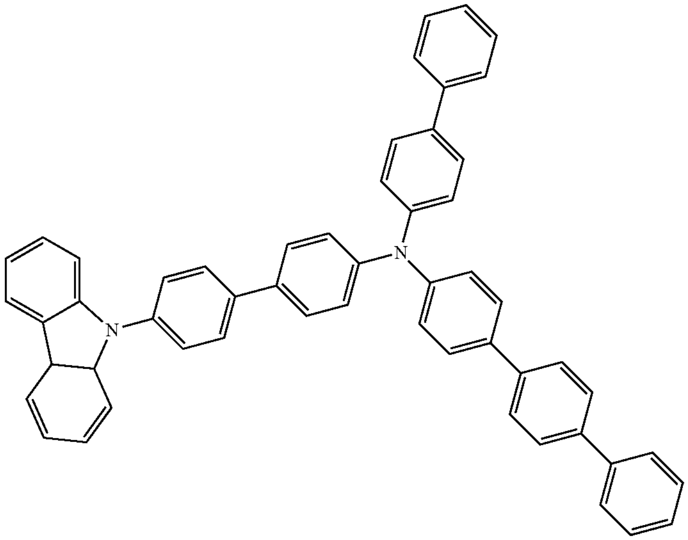

-continued

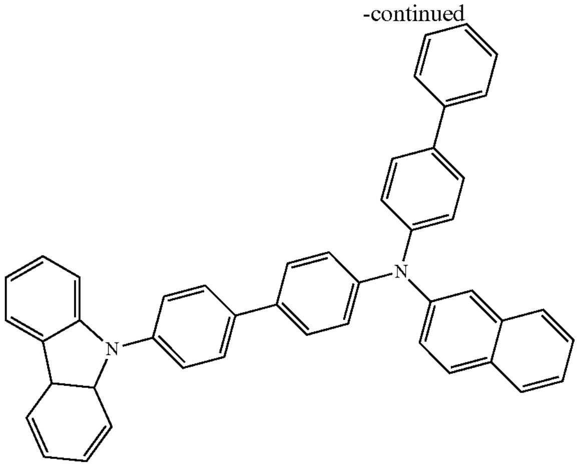

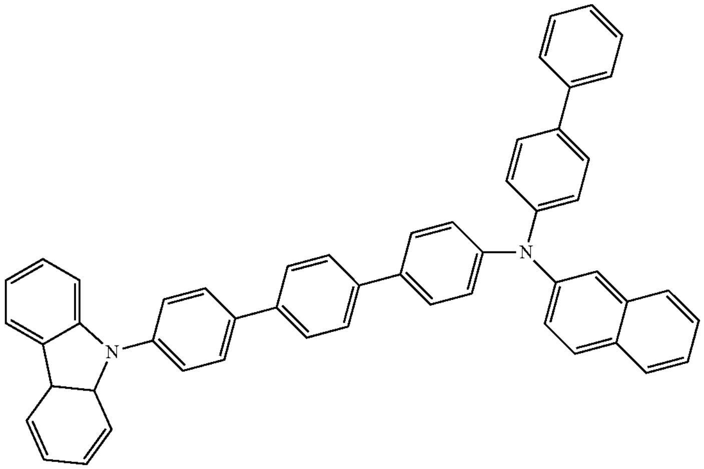

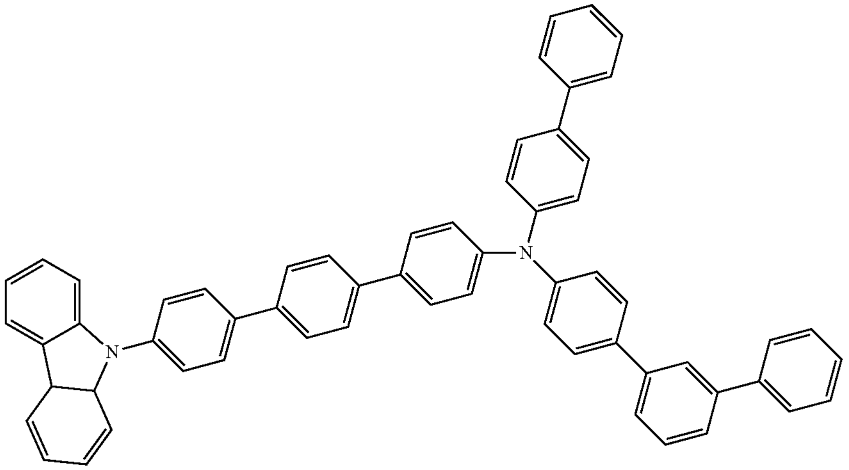

A display apparatus includes the aforementioned organic light emitting device.

Other aspects will become apparent upon reading and understanding accompanying drawings and the detailed description.

BRIEF DESCRIPTION OF DRAWINGS

The attached drawings are for providing a further understanding of the technical scheme of the present disclosure and constitute a part of the description. They are for explaining the technical scheme of the present disclosure together with the embodiments of the present application and do not constitute a limitation on the technical scheme of the present disclosure. Shapes and sizes of various components in the drawings do not reflect true scales and are intended to illustrate schematically contents of the present disclosure only.

DETAILED DESCRIPTION

Figure 1:
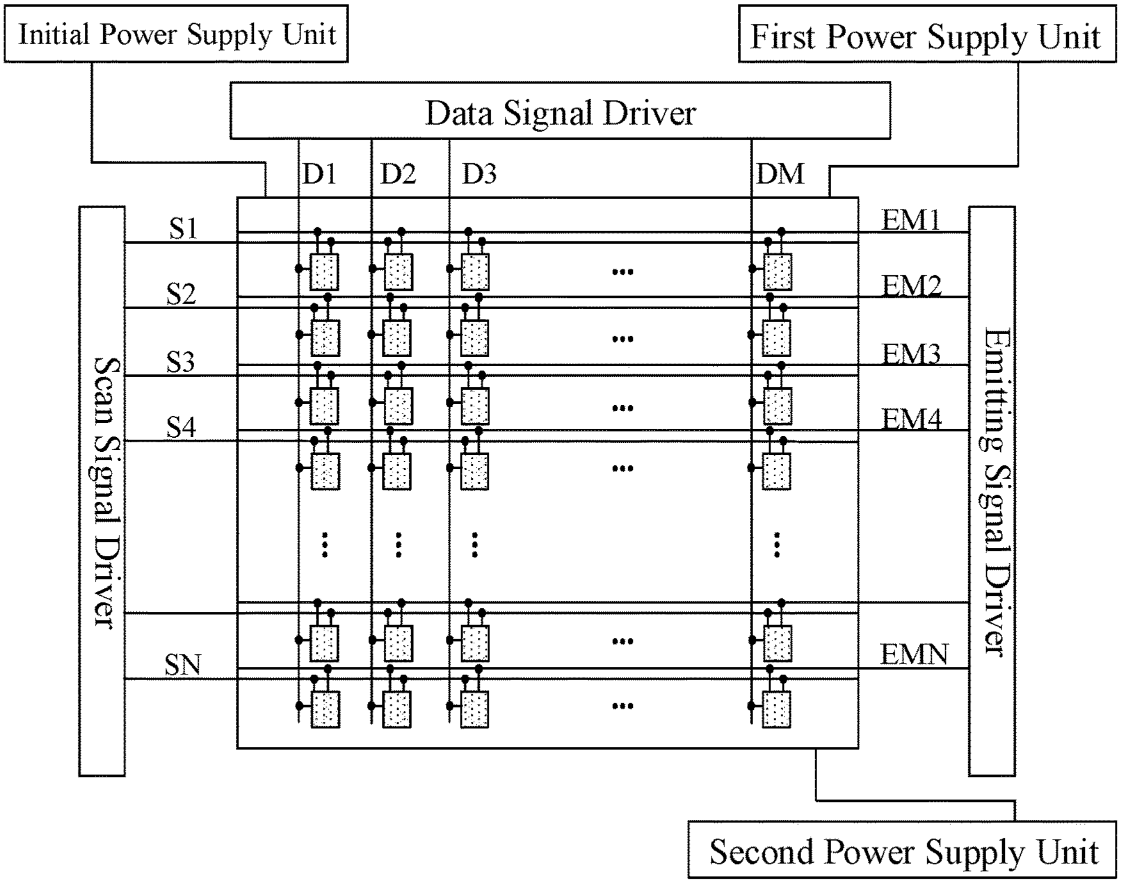
FIG. 1 is a schematic structural diagram of an OLED display apparatus.

The embodiments herein may be implemented in a number of different ways. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of a constituent element, a thickness of a layer or an area of the layer may be sometimes exaggerated for clarity. Therefore, any implementation mode of the present disclosure is not necessarily limited to a size shown in the drawings, and the shapes and sizes of the components in the drawings do not reflect true proportions. In addition, the drawings schematically show ideal examples, and any implementation mode of the present disclosure is not limited to the shapes or values shown in the drawings.

In this disclosure, the "first", "second", "third" and other ordinal numbers are used to avoid confusion of constituent elements, but not to limit in quantity.

In the present disclosure, for sake of convenience, wordings such as "central", "upper", "lower", "front", "rear", "vertical", "horizontal", "top", "bottom", "inner", "outer" and the like describe the orientations or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements may be appropriately changed according to the direction in which each constituent element is described. Therefore, they are not limited to the wordings in this disclosure, and may be replaced appropriately according to the situations.

In the present disclosure, the terms "installed", "connected" and "coupled" shall be broadly understood unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to situations.

In the present disclosure, a transistor refers to an element that includes at least three terminals: a gate electrode, a drain electrode, and a source electrode. The transistor has a channel region between the drain electrode (or referred to as a drain electrode terminal, a drain region or a drain electrode) and the source electrode (or referred to as a source electrode terminal, a source region or a source electrode), and a current can flow through the drain electrode, the channel region and the source electrode. In this disclosure, the channel region refers to a region through which a current mainly flows.

In the present disclosure, the first electrode may be a drain electrode and the second electrode may be a source electrode, or the first electrode may be a source electrode and the second electrode may be a drain electrode. In a situation where transistors with opposite polarities are used or a current direction is changed in an operation of a circuit, a function of the "source electrode" and a function of the "drain electrode" can sometimes be interchangeable. Therefore, the "source electrode" and the "drain electrode" can be interchangeable in this disclosure.

In the present disclosure, an "electrical connection" includes a case where constituent elements are connected via an element having a certain electrical action. The "element with a certain electric action" is not particularly limited as long as it can transmit and receive electrical signals between the connected constituent elements. An "element with a certain electrical action" may be, for example, an electrode or wiring, a switching element such as a transistor, or other functional elements such as a resistor, an inductor or a capacitor, etc.

Herein, "parallel" refers to a state in which two straight lines form an angle of −10 degrees or more and 10 degrees or less, and thus also includes a state in which the angle is −5 degrees or more and 5 degrees or less. In addition, "perpendicular" refers to a case where an angle formed by two straight lines is above −80° and below 100°, and thus also includes a case where the angle is above −85° and below 95°.

In the present disclosure, a "film" and a "layer" are interchangeable. For example, sometimes "conductive layer" may be replaced by "conductive film". Similarly, "insulating film" may sometimes be replaced by "insulating layer".

The wording "about" herein means that the limit is not strictly set, and a value within the range of process and measurement errors is allowed.

FIG. 1 is a schematic structural diagram of an OLED display apparatus. As shown in FIG. 1, the OLED display apparatus may include a scanning signal driver, a data signal driver, a light-emitting signal driver, an OLED display panel, a first power supply unit, a second power supply unit and an initial power supply unit. In an exemplary embodiment, the OLED display substrate at least includes a plurality of scan signal lines (S1 to SN), a plurality of data signal lines (D1 to DM) and a plurality of emitting signal lines (EM1 to EMN); the scan signal driver is configured to sequentially supply scan signals to the plurality of scan signal lines (S1 to SN), the data signal driver is configured to supply data signals to the plurality of data signal lines (D1 to DM), and the emitting signal driver is configured to sequentially supply emitting control signals to the plurality of emitting signal lines (EM1 to EMN). In an exemplary embodiment, the plurality of scan signal lines and the plurality of emitting signal lines extend along a horizontal direction, and the plurality of data signal lines extend along a vertical direction. The display apparatus includes a plurality of sub-pixels. One sub-pixel includes a pixel drive circuit and an emitting device. The pixel drive circuit is connected to a scan signal line, an emitting control line, and a data signal line. The pixel drive circuit is configured to receive data voltage transmitted by the data signal line under control of the scan signal line and the emitting signal line, and output a corresponding current to the emitting device, the emitting device is connected to the pixel drive circuit, and the emitting device is configured to emit light of corresponding brightness in response to the current output by the pixel drive circuit. The first power supply unit, the second power supply unit and the initial power supply unit are respectively configured to supply a first power supply voltage, a second power supply voltage and an initial power supply voltage to a pixel drive circuit through a first power supply line, a second power supply line and an initial signal line.

Figure 2:
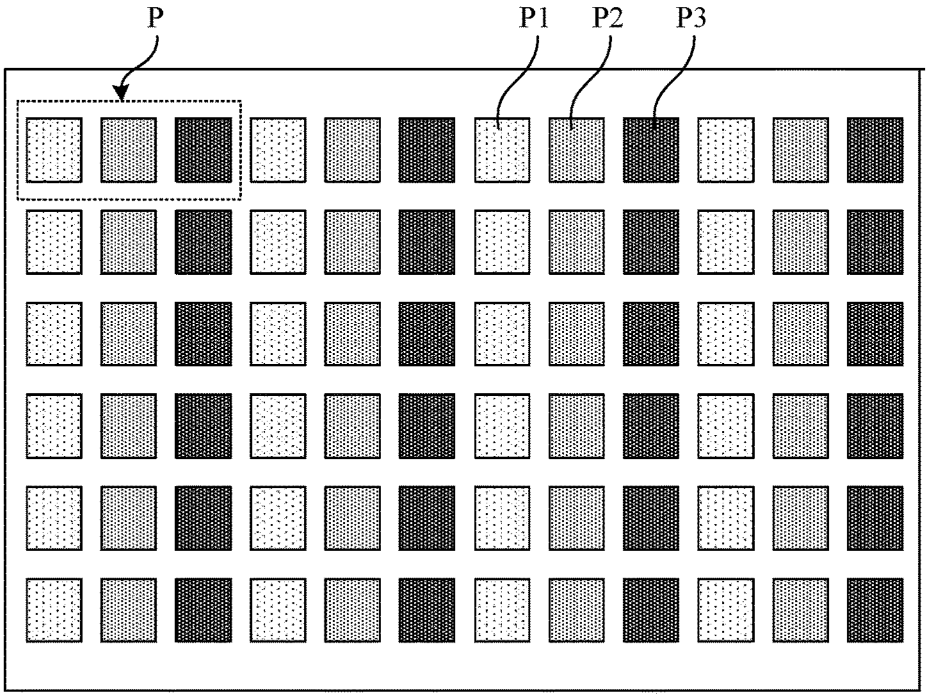
FIG. 2 is a schematic diagram of a planar structure of a display substrate.

FIG. 2 is a schematic diagram of a planar structure of a display substrate. As shown in FIG. 2, the display area may include a plurality of pixel units P arranged in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel driving circuit and a light-emitting device. In an exemplary embodiment, the pixel unit P may include red (R), green (G) and blue (B) sub-pixels, or may include red, green, blue and white (W) sub-pixels, which is not limited in the present disclosure. In an exemplary embodiment, a shape of the sub-pixel in the pixel unit may be rectangular, diamond, pentagonal or hexagonal. When the pixel unit includes three sub-pixels, the three sub-pixels may be arranged in a manner to stand side by side horizontally, in a manner to stand side by side vertically, or in a pyramid manner with two units sitting at the bottom and one unit placed on top. When the pixel unit includes four sub-pixels, the four sub-pixels may be arranged in a manner to stand side by side horizontally, in a manner to stand side by side vertically, or in a manner to form a square, which is not specifically limited in the present disclosure.

Figure 3:
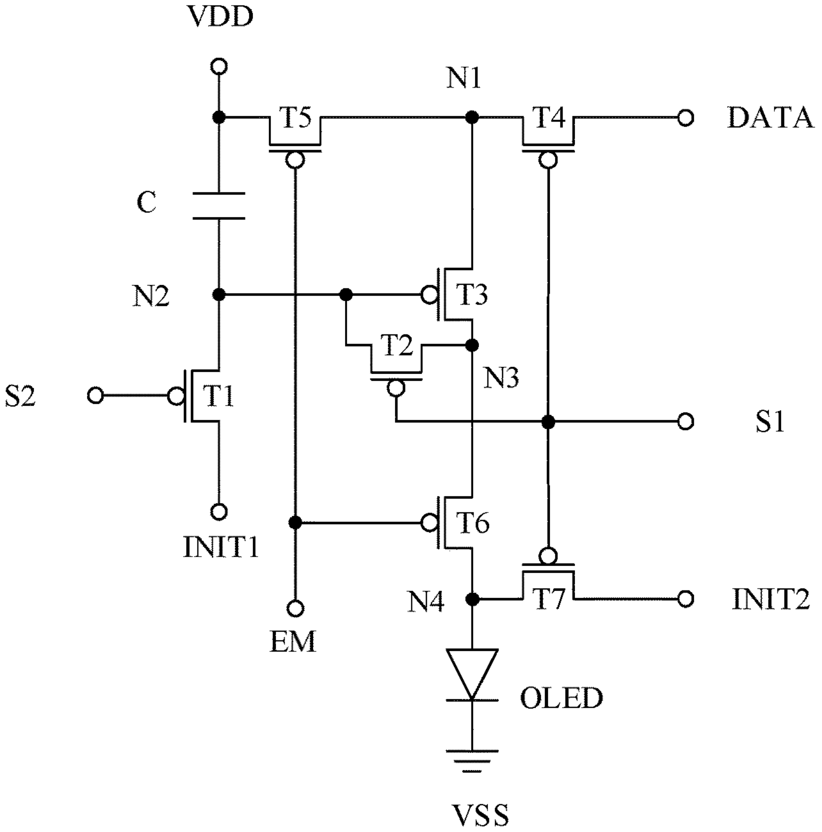
FIG. 3 is an equivalent circuit diagram of a pixel driving circuit.

In an exemplary implementation, the pixel driving circuit may have a structure of 3T1C, 4T1C, 5T1C, 5T2C, 6T1C or 7T1C. FIG. 3 is an equivalent circuit diagram of a pixel driving circuit. As shown in FIG. 3, the pixel drive circuit may include seven switch transistors (a first transistor T1 to a seventh transistor T7), a storage capacitor C and eight signal lines (a data signal line DATA, a first scan signal line S1, a second scan signal line S2, a first initial signal line INIT1, a second initial signal line INIT2, a first power supply line VSS, a second power supply line VDD and an emitting signal line EM). The first initial signal line INIT1 and the second initial signal line INIT2 may be the same signal line.

In an exemplary implementation, a control electrode of the first transistor T1 is connected to the second scan signal line S2, a first electrode of the first transistor T1 is connected to the first initial signal line INIT1, and a second electrode of the first transistor is connected to a second node N2. A control electrode of the second transistor T2 is connected to the first scan signal line S1, a first electrode of the second transistor T2 is connected to the second node N2, and a second electrode of the second transistor T2 is connected to a third node N3. A control electrode of the third transistor T3 is connected with the second node N2, a first electrode of the third transistor T3 is connected with the first node N1, and a second electrode of the third transistor T3 is connected with the third node N3. A control electrode of the fourth transistor T4 is connected to the first scan signal line S1, a first electrode of the fourth transistor T4 is connected to the data signal line DATA, and a second electrode of the fourth transistor T4 is connected to the first node N1. A control electrode of the fifth transistor T5 is connected with the light-emitting signal line EM, a first electrode of the fifth transistor T5 is connected with the second power supply line VDD, and a second electrode of the fifth transistor T5 is connected with the first node N1. A control electrode of the sixth transistor T6 is connected with the light emitting signal line EM, a first electrode of the sixth transistor T6 is connected with the third node N3, and a second electrode of the sixth transistor T6 is connected with a first electrode of the light-emitting device. A control electrode of the seventh transistor T7 is connected to the first scan signal line S1, a first electrode of the seventh transistor T7 is connected to the second initial signal line INIT2, and a second electrode of the seventh transistor T7 is connected to the first electrode of the light-emitting device. A first terminal of the storage capacitor C is connected to the second power supply line VDD, and a second terminal of the storage capacitor C is connected to the second node N2.

In an exemplary implementation, the first transistor T1 to the seventh transistor T7 may be P-type transistors or may be N-type transistors. Adopting transistors of the same type in the pixel driving circuit may simplify a process flow, reduce difficulty in a preparation process of the display panel, and improve a product yield rate. In some possible implementations, the first transistor T1 to the seventh transistor T7 may include P-type transistors and N-type transistors.

In an exemplary implementation, a second electrode of the light emitting device is connected with the first power supply line VSS. A signal on the first power supply line VSS is a low level signal, and a signal on the second power supply line VDD is a high level signal that is continuously supplied. The first scan signal line S1 is a scan signal line for a pixel driving circuit of a current display row, and the second scan signal line S2 is a scan signal line for a pixel driving circuit of a previous display row. That is, for an nth display row, the first scan signal line S1 is S(n), the second scan signal line S2 is S(n−1), the second scan signal line S2 of the current display row and the first scan signal line S1 for the pixel driving circuit of the previous display row are the same signal line, which may reduce the signal lines of the display panel and realize the narrow frame of the display panel.

Figure 4:
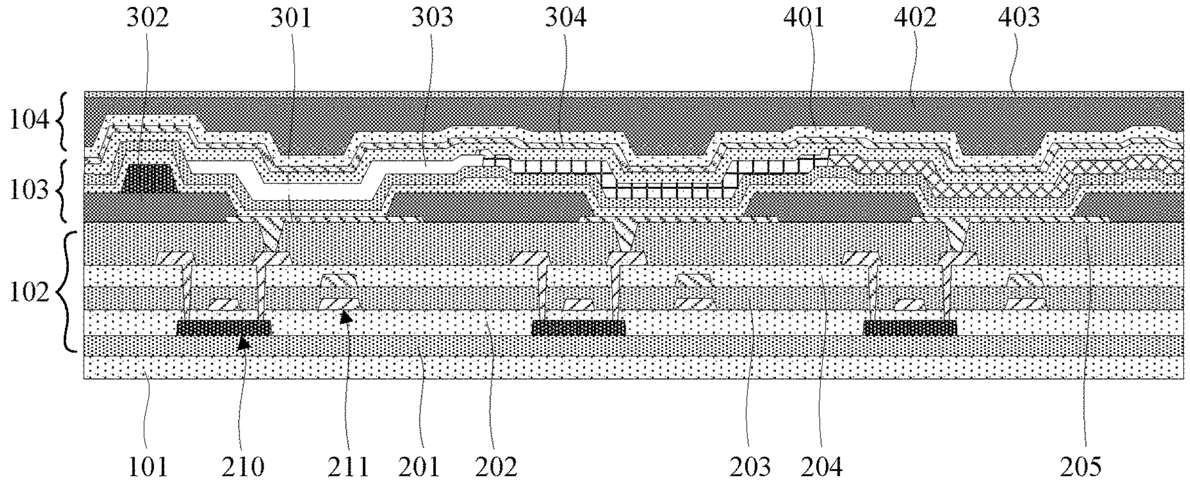
FIG. 4 is a schematic sectional view of a display substrate.

FIG. 4 is a schematic sectional view of a display substrate, showing a structure of three sub-pixels in an OLED display substrate. As shown in FIG. 4, on a plane perpendicular to the display substrate, the display substrate may include a drive circuit layer 102 disposed on a base substrate 101, a light-emitting device 103 disposed on a side of the drive circuit layer 102 away from the base substrate 101, and an encapsulation layer 104 disposed on a side of the light-emitting device 103 away from the base substrate 101. In some possible implementations, the display substrate may include other film layers, such as spacer posts, etc., which is not limited in the present disclosure.

In an exemplary implementation, the base substrate may be a flexible base substrate or may be a rigid base substrate. The flexible base substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the base substrate; and the material of the semiconductor layer may be amorphous silicon (a-si).

In an exemplary embodiment, the drive circuit layer 102 of each sub-pixel may include a plurality of transistors and a storage capacitor constituting a pixel drive circuit. An example in which each sub-pixel includes a drive transistor and a storage capacitor is illustrated in FIG. 3. In some possible implementations, the drive circuit layer 102 of each sub-pixel may include: a first insulating layer 201 disposed on the base substrate; an active layer disposed on the first insulating layer; a second insulating layer 202 covering the active layer; a gate electrode and a first capacitor electrode disposed on the second insulating layer 202; a third insulating layer 203 covering the gate electrode and the first capacitor electrode; a second capacitor electrode disposed on the third insulating layer 203; a fourth insulating layer 204 covering the second capacitor electrode, wherein the second insulating layer 202, the third insulating layer 203 and the fourth insulating layer 204 are provided with via holes exposing the active layer; a source electrode and a drain electrode disposed on the fourth insulating layer 204, wherein the source electrode and the drain electrode are respectively connected to the active layer through via holes; and a planarization layer 205 covering the aforementioned structure, wherein the planarization layer 205 is provided with a via hole exposing the drain electrode. The active layer, the gate electrode, the source electrode and the drain electrode form a drive transistor 210. The first capacitor electrode and the second capacitor electrode form a storage capacitor 211.

In an exemplary embodiment, the light-emitting device 103 may include an anode 301, a pixel defining layer 302, an organic emitting layer 303 and a cathode 304. The anode 301 is disposed on the planarization layer 205, and is connected to the drain electrode of the drive transistor 210 through a via hole disposed on the planarization layer 205; the pixel define layer 302 is disposed on the anode 301 and the planarization layer 205, and the pixel define layer 302 is provided with a pixel opening exposing the anode 301; the organic emitting layer 303 is at least partially disposed in the pixel opening, and is connected to the anode 301; the cathode 304 is disposed on the organic emitting layer 303, and is connected to the organic emitting layer 303; and the organic emitting layer 303 emits light of corresponding colors under the drive of the anode 301 and the cathode 304.

In an exemplary embodiment, an encapsulation layer 104 may include a first encapsulation layer 401, a second encapsulation layer 402 and a third encapsulation layer 403 that are stacked; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor may not enter into the emitting device 103.

In an exemplary embodiment, the organic emitting layer of the OLED emitting element may include an Emitting Layer (EML), and one or more film layers selected from a Hole Injection Layer (HIL), a Hole Transport Layer (HTL), a Hole blocking layer (HBL), an Electron blocking layer (EBL), an Electron Injection Layer (EIL) and an Electron transporting layer (ETL). Driven by voltages of the anode and the cathode, light is emitted using the light-emitting characteristics of the organic material according to the required gray scale.

In an exemplary embodiment, the emitting layers of OLED emitting elements of different colors are different. For example, red emitting element includes a red emitting layer, green emitting element includes a green emitting layer, and blue emitting element includes a blue emitting layer. In order to reduce the process difficulty and improve the yield, a common layer may be used for the hole injection layer and the hole transport layer on a side of the emitting layer, and a common layer may be used for the electron injection layer and the electron transporting layer on the other side of the emitting layer. In an exemplary embodiment, any one or more layers of the hole injection layer, the hole transport layer, the electron injection layer and the electron transporting layer may be manufactured by one-time process (one-time evaporation process or one-time ink-jet printing process), but the isolation is realized by means of the height difference of formed film layer or by means of the surface treatment. For example, any one or more layers of the hole injection layer, the hole transport layer, the electron injection layer and the electron transporting layer corresponding to adjacent sub-pixels may be isolated. In an exemplary embodiment, the organic emitting layer may be formed by evaporation using a Fine Metal Mask (FMM) or an Open Mask, or through an ink jet process.

With the continuous development of products, the market demands increasingly high resolution of products, increasingly high brightness of independent sub-pixels and increasingly low power consumption of products, thus putting forward higher requirements for efficiency, brightness, voltage and service life of devices. In an OLED structure, the blue emitting element and the green emitting element has a short service life, which leads to white balance color drift after long-term use, and visually, phenomena such as turning red, green and pink may show up when a white screen is on. Although the research on new emitting layer materials may improve service lives of emitting elements, after years of development, not only the cost of an improvement of the service lives from a material aspect is getting increasingly high, but a potential promotion is getting increasingly small.

Figure 5:
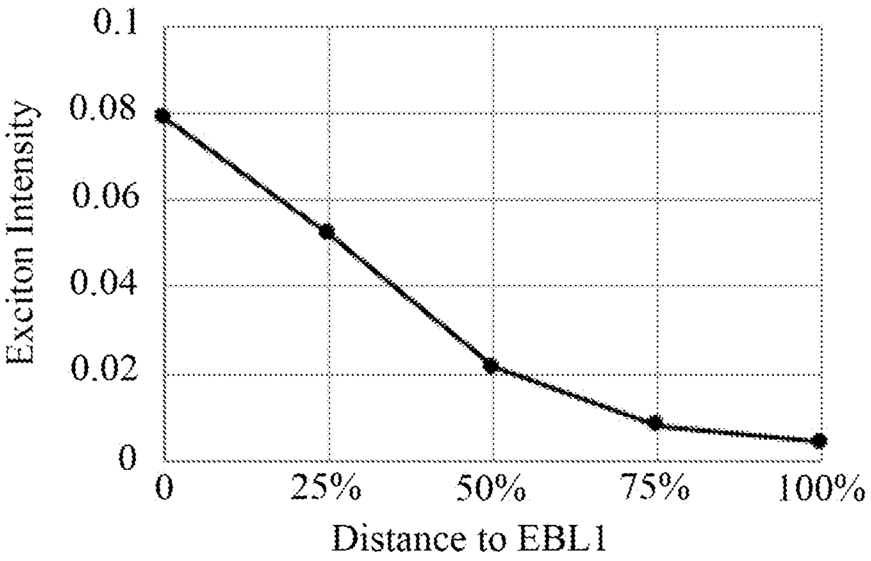
FIG. 5 is a distribution diagram of an exciton recombination region in an emitting layer.
Figure 6:
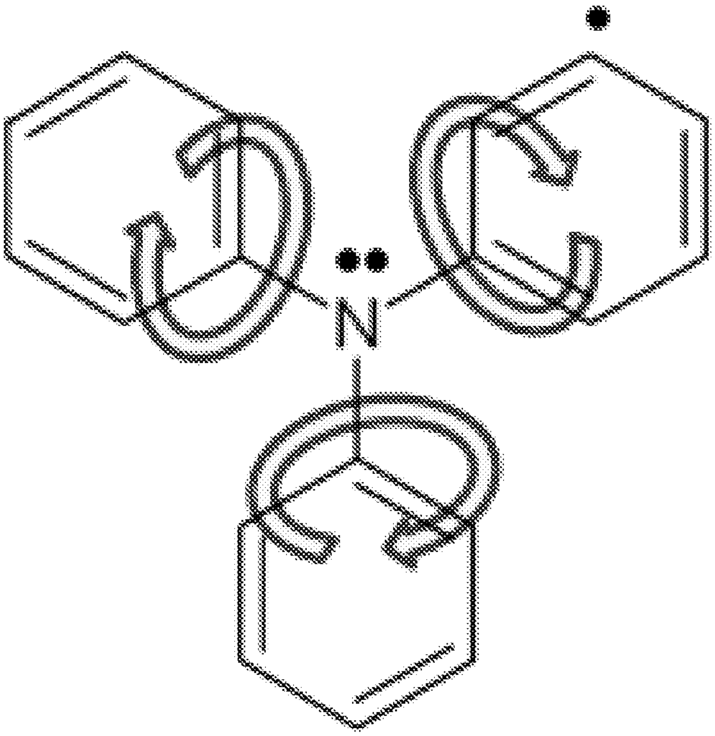
FIG. 6 is a schematic diagram of bond torsion of an electron blocking layer.

A research shows that the service life attenuation of monochromatic emitting elements in OLED is mainly caused by interface degradations and material defects. A main reason for the interface degradations is that energy barriers at the interface are too large and accumulated charges are a lot. For example, interfaces on both sides of the emitting layer are key interfaces where holes and electrons are injected into the emitting layer, and the energy level matching between the two interfaces may easily lead to carrier accumulation, and the charge accumulation may easily lead to an interface deterioration and accelerate life service decay of devices. A main reason for the material defects is a distortion of bonds or a fracture of bonds. For example, a material that is easy to deteriorate in an OLED is a material of an electron blocking layer. FIG. 5 is a distribution diagram of an exciton recombination region in an emitting layer, and FIG. 6 is a schematic diagram of bond torsion of an electron blocking layer. The exciton recombination region of the emitting layer is mainly concentrated at 0% of an interface between the electron blocking layer and the emitting layer, which makes excessive electrons accumulate at the interface, as shown in FIG. 5. Generally, a material of an electron blocking layer is an electron-abundance system material and contains aniline structure. Excessive accumulated electrons will have a repulsive force with abundance electrons of the electron blocking layer, which will cause a distortion of the δbond of benzene rings on aniline, and a result of the distortion of the δbond caused by the external force is bond fracture, leading to material defects and rapid service life decay of devices, as shown in FIG. 6.

Figure 7:
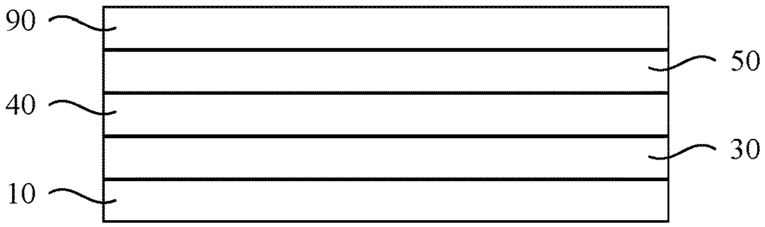
FIG. 7 is a schematic diagram of an OLED structure according to an exemplary embodiment of the present disclosure.

FIG. 7 is a schematic diagram of an OLED structure according to an exemplary embodiment of the present disclosure. As shown in FIG. 7, the OLED includes an anode 10, a cathode 90, and an organic emitting layer disposed between the anode 10 and the cathode 90. In an exemplary embodiment, the organic light emitting layer may include a hole transport layer 30, an electron blocking layer 40, and a light emitting layer 50 which are stacked, and the hole transport layer 30 and the electron blocking layer 40 are disposed between the anode 10 and the emitting layer 50, The hole transport layer 30 is disposed on a side of the anode 10 near the emitting layer 50, and the electron blocking layer 40 is disposed on a side of the emitting layer 50 near the anode 10 that is, the hole transport layer 30 is disposed between the anode 10 and the electron blocking layer 40, and the electron blocking layer 40 is disposed between the hole transport layer 30 and the light emitting layer 50. In an exemplary embodiment, the hole transport layer 30 is configured to realize directional and orderly controlled migration of injected holes, the electron blocking layer 40 is configured to form a migration barrier for electrons and prevent electrons from migrating out of the emitting layer 50, and the emitting layer 50 is configured to recombine electrons and holes to emit light.

Figure 8:
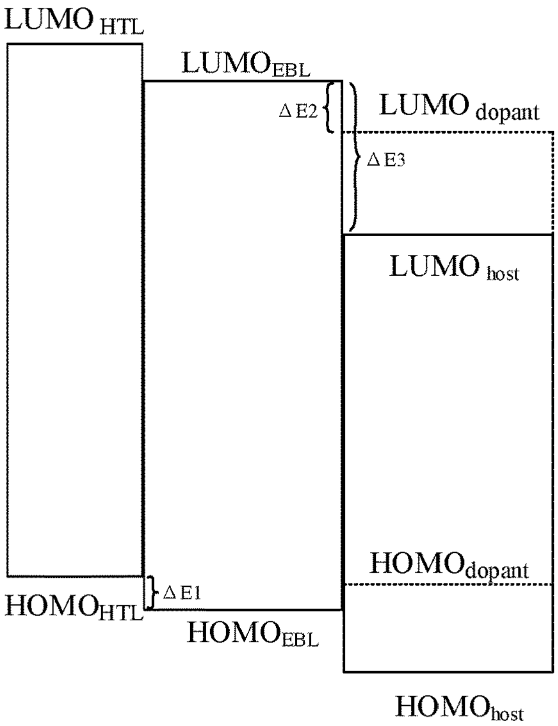
FIG. 8 is a schematic diagram of an energy level relationship of an OLED structure according to an exemplary embodiment of the present disclosure.

In an exemplary embodiment, the emitting layer 50 includes a Host material and a Dopant material doped in the host material. FIG. 8 is a schematic diagram of an energy level relationship of an OLED structure according to an exemplary embodiment of the present disclosure. As shown in FIG. 8, in an exemplary embodiment, a Highest Occupied Molecular Orbit (HOMO) energy level of a hole transport layer HTL, $HOMO_{HTL}$, is higher than a HOMO energy level of an electron blocking layer EBL, $HOMO_{EBL}$; the HOMO energy level of the electron blocking layer HTL, $HOMO_{HTL}$, is higher than a HOMO energy level of a host material of the emitting layer, $HOMO_{host}$; a HOMO energy level of a dopant material of the emitting layer, $HOMO_{dopant}$, is higher than the HOMO energy level of the host material of the emitting layer, HOMOhost. a lowest Occupied Molecular Orbit (LUMO) energy level of the hole transport layer HTL, LUMOHTL, is higher than a LUMO energy level of the electron blocking layer EBL, $LUMO_{EBL}$; a LUMO energy level of the electron blocking layer EBL, $LUMO_{EBL}$, is higher than a LUMO energy level of the dopant material of the emitting layer, $LUMO_{dopant}$; and the LUMO energy level of the dopant material of the emitting layer, $LUMO_{dopant}$ is higher than a LUMO energy level of the host material of the emitting layer, $LUMO_{host}$.

In an exemplary embodiment, the hole transport layer and the electron blocking layer may satisfy:

$$|HOMO_{HTL}-HOMO_{EBL}|\leq 0.2\text{ eV, i.e. }\Delta E1<0.2\text{ eV.}$$

In an exemplary embodiment, by setting a HOMO energy level relationship between the hole transport layer and the electron blocking layer, an energy level gap between the hole transport layer and the electron blocking layer may be reduced, hole transport performance may be increased, and an interface accumulation may be reduced.

In an exemplary embodiment, the electron blocking layer and the dopant material of the emitting layer may satisfy:

$$|HOMO_{dopant}|\leq|HOMO_{EBL}|.$$

In an exemplary embodiment, because the host material of the emitting layer has a wide band and deep HOMO energy level, there is a large energy barrier between the host material of the emitting layer and the electron blocking layer. By setting a relationship of a HOMO energy level between the electron blocking layer and the dopant material of the emitting layer and setting an absolute value of the HOMO energy level of the dopant material of the emitting layer to be smaller than or equal to an absolute value of the HOMO energy level of the electron blocking layer, it may be beneficial for the dopant material of the emitting layer to capture holes into emitting layer.

In an exemplary embodiment, the electron blocking layer and the emitting layer may satisfy:

$$|LUMO_{EBL}-LUMO_{dopant}|>0.1\text{ eV, i.e. }\Delta E2>0.1\text{ eV.}$$

$$|LUMO_{EBL}-LUMO_{host}|>0.4\text{ eV, i.e., }\Delta E3>0.4\text{ eV.}$$

In an exemplary embodiment, by setting a LUMO energy level relationship between the electron blocking layer and the emitting layer, it may be beneficial to improve a capability of the electron blocking layer to block electrons.

In an exemplary embodiment, the host material of the emitting layer and the dopant material of the emitting layer may satisfy:

$$|LUMO_{dopant}|<|LUMO_{host}|.$$

In an exemplary embodiment, by setting a LUMO energy level relationship between the host material of the emitting layer and the dopant material of the emitting layer, it may be beneficial to improve a capability of the emitting layer to scatter electrons.

In an exemplary embodiment, hole mobility of the hole transport layer is greater than 10 times that of the electron blocking layer.

In an exemplary embodiment, the hole mobility of the hole transport layer is $10^{-2}$ $cm^2/Vs$ to $10^{-6}$ $cm^2/Vs$, and the hole mobility of the electron blocking layer is $10^{-4}$ $cm^2/Vs$ to $10^{-6}$ $cm^2/Vs$.

In an exemplary embodiment, the hole mobility of the electron blocking layer is greater than 100 times that of the host material of the emitting layer.

In an exemplary embodiment, the hole mobility of the host material of the emitting layer is $10^{-9}$ $cm^2/Vs$ to $10^{-10}$ $cm^2/Vs$.

In an exemplary embodiment, electron mobility of the host material of the emitting layer is greater than the hole mobility of the host material of the emitting layer.

In an exemplary embodiment, the electron mobility of the host material of the emitting layer is $10^{-6}$ $cm^2/Vs$ to $10^{-8}$ $cm^2/Vs$ In an exemplary embodiment, electron mobility of the hole transport layer is less than $10^{-8}$ $cm^2/Vs$; and electron mobility of the electron blocking layer is less than $10^{-8}$ $cm^2/Vs$.

In an exemplary embodiment, electron mobility of the dopant material of the emitting layer is $10^{-8}$ $cm^2/Vs$ to $10^{-10}$ $cm^2/Vs$.

In an exemplary embodiment, a HOMO energy level of the hole transport layer may be about −5.0 eV to −5.5 eV, a HOMO energy level of the electron blocking layer may be about −5.2 eV to −5.6 eV, a HOMO energy level of the host material of the light emitting layer may be about −5.3 eV to −5.7 eV, and a HOMO energy level of the dopant material of the light emitting layer may be about −5.25 eV to −5.5 eV.

In an exemplary embodiment, a LUMO level of the hole transport layer may be about −2.0 eV to −2.4 eV, a LUMO level of the electron blocking layer may be about −2.2 eV to −2.6 eV, a LUMO level of the host material of the emitting layer may be about −2.5 eV to −2.9 eV, and a LUMO level of the dopant material of the emitting layer may be about −2.2 eV to −2.6 eV.

In an exemplary embodiment, a thickness of a hole transport layer 30 is about 60 nm to 150 nm.

In an exemplary embodiment, a thickness of an electron blocking layer 40 is about 5 nm to 20 nm.

In an exemplary embodiment, a thickness of an emitting layer 50 is about 10 nm to 25 nm. In an exemplary embodiment, a thickness of the emitting layer 50 is different from that of the electron blocking layer 40. For example, a thickness of the emitting layer 50 may be greater than that of the electron blocking layer 40.

In an exemplary embodiment, a HOMO energy level and a LUMO energy level may be measured by photoelectron spectrophotometer (AC3/AC2) or ultraviolet (UV) spectroscopy, electron mobility may be measured by space charge limited current method (SCLC).

In an exemplary embodiment, a doping ratio of the dopant material of the emitting layer is about 1% to 20%. Within a range of the doping ratio, on the one hand, the host material of the emitting layer may effectively transfer exciton energy to the dopant material of the emitting layer to stimulate the dopant material of the emitting layer to emit light, on the other hand, the host material of the emitting layer "dilutes" the dopant material of the emitting layer, which effectively improves fluorescence quenching caused by a collision between molecules of the dopant material of the emitting layer and a collision between energies, and improves a luminance efficiency and a service life of a device.

In an exemplary embodiment of the present disclosure, a doping ratio refers to a ratio of mass of the dopant material to mass of the emitting layer, that is, mass percentage. In an exemplary embodiment, the host material and the dopant material are co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process.

In an exemplary embodiment, the emitting layer is a blue emitting layer. An overall performance of an organic light emitting device may be better improved by increasing luminance efficiency and a service life of the blue emitting layer.

In an OLED structure, an exciton recombination region is mainly concentrated at an interface between the emitting layer and the electron blocking layer, which makes excessive electrons accumulate at the interface. The accumulated electrons will lead to a material cracking of the electron blocking layer, thus reducing stability and a service life of the material. According to the exemplary embodiment of the present disclosure, by reasonably matching an energy level relationship, mobility relationship, or a relationship between an energy level and mobility of the hole transport layer, the electron blocking layer, and the host and dopant materials of the emitting layer, the interface is optimized from the energy level matching structure, which is beneficial to carrier transmission into the emitting layer, a reduction in a carrier accumulation at an interface, an increase in hole concentration in the emitting layer from the mobility relationship, making the exciton recombination region move toward a center of the emitting layer, and away from the electron blocking layer. In this way, an electron accumulation at the surface between the emitting layer and the electron blocking layer is reduced, and the damage to the electron blocking layer is decreased. The damage to the electron blocking layer is reduced while the accumulation of interface charges is reduced, so that the material stability of the electron blocking layer is improved, the material degradation and performance degradation caused by the electron accumulation are reduced, the service life of the device is prolonged, and the luminance efficiency is improved.

In an exemplary embodiment, a material of the hole transport layer may include, but is not limited to, a compound having a structure shown in Formula 1:

Formula 1

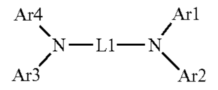

Wherein, Ar1 to Ar4 are independently substituted or unsubstituted aryl groups having 6 to 30 ring carbon atoms, or substituted or unsubstituted heteroaryl groups having 5 to 20 ring atoms. L1 is a substituted or unsubstituted aryl, heteroaryl, fluorene, dibenzofuran or thiophene with 6-30 carbon atoms, a combination thereof.

In an exemplary embodiment, the compound of the structure shown in Formula 1 contains a diamine structure, which is beneficial to an improvement of the hole mobility of the material, and is beneficial to an increase in the holes. An actual measurement shows that the hole mobility of the compound with the structure shown in Formula 1 is greater than or equal to $1*10^{-4}$ $cm^2/Vs$@0.25 MV/cm. The hole mobility changes with an intensity of an electric field, and @0.25 MV/cm refers to the hole mobility under the electric field.

In an exemplary embodiment, the hole transport layer may include, but is not limited to, compounds having structures shown in Formula 1-1 to Formula 1-8:

Formula 1-1

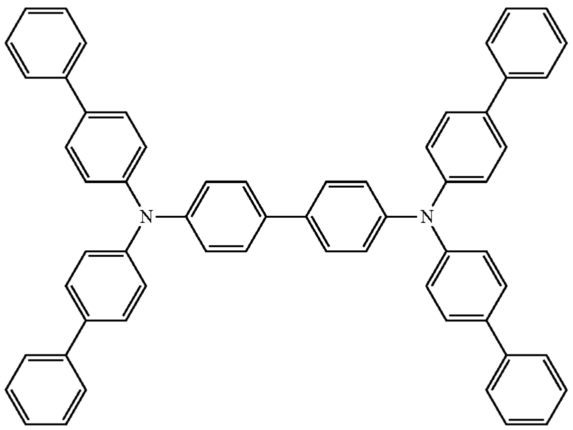

-continued
Formula 1-2
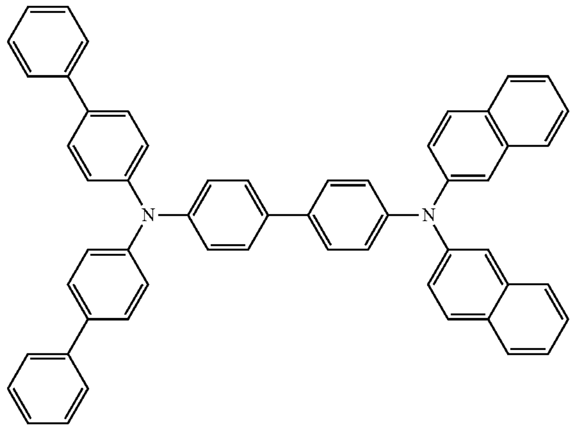
Formula 1-3
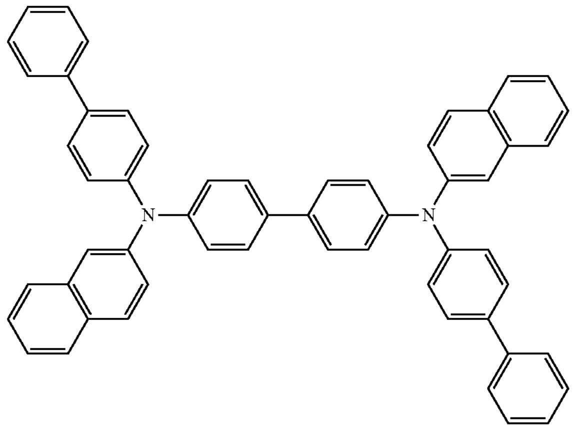
Formula 1-4
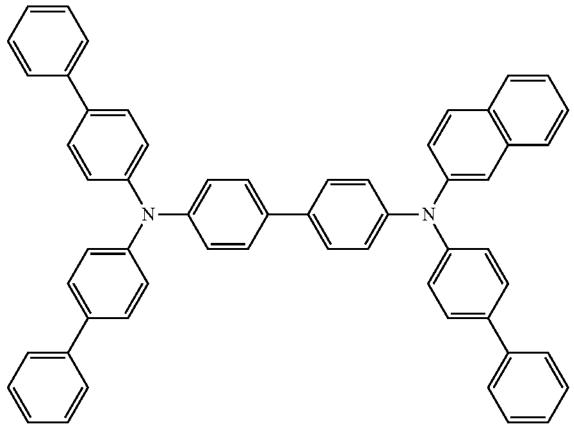
-continued
Formula 1-5
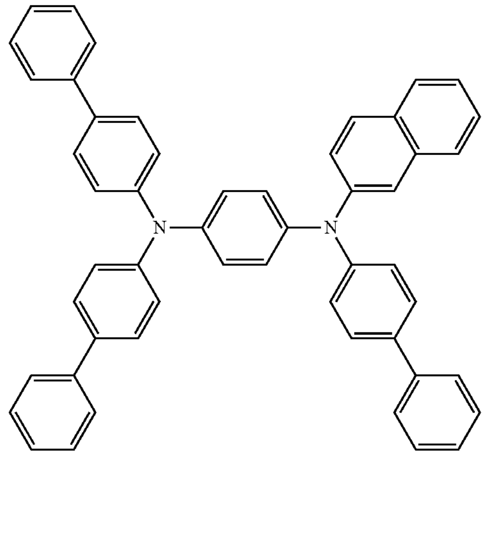
Formula 1-6
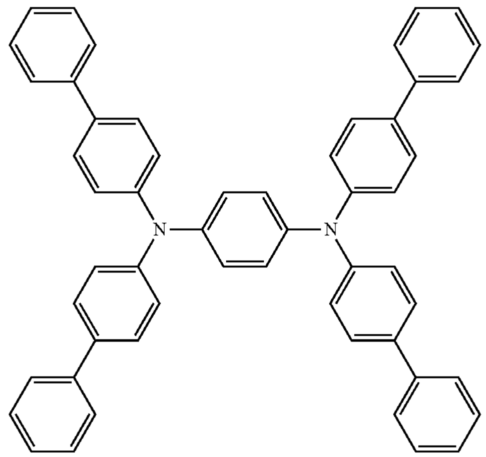
Formula 1-7
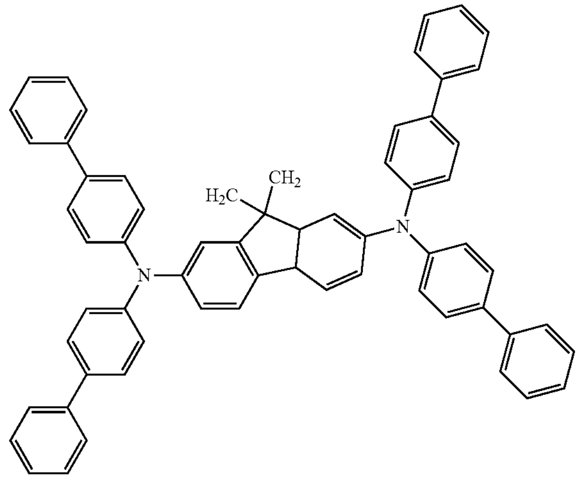

-continued

Formula 1-8

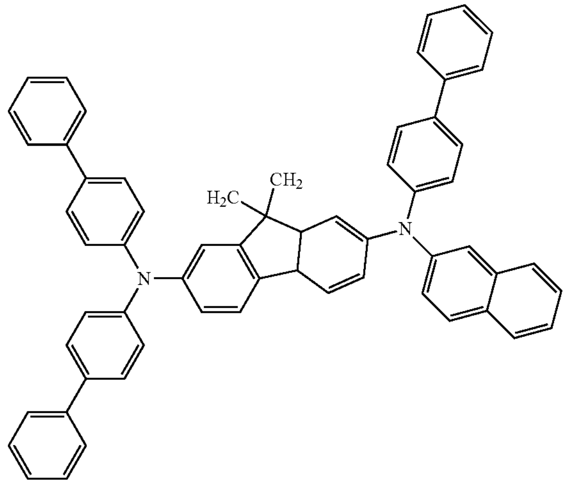

In an exemplary embodiment, the electron blocking layer may include, but is not limited to, a compound having a structure shown in Formula 2:

Formula 2

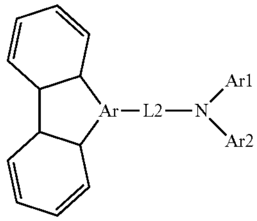

Wherein, Ar1 to Ar2 are independently substituted or unsubstituted aryl groups having 6 to 30 ring carbon atoms, or substituted or unsubstituted heteroaryl groups having 5 to 20 ring atoms. L2 is a substituted or unsubstituted aryl, heteroaryl, fluorene, dibenzofuran or thiophene with 6-30 carbon atoms, a combination thereof.

In an exemplary embodiment, the compound of the structure shown in Formula 2 may increase a lowest triplet energy T1 to ensure that excitons in the emitting layer are confined in the emitting layer.

In an exemplary embodiment, a lowest triplet energy T1 of the electron blocking layer is greater than 2.3 eV.

In an exemplary embodiment, the electron blocking layer may include, but is not limited to, compounds having structures shown in Formula 2-1 to Formula 2-5:

Formula 2-1

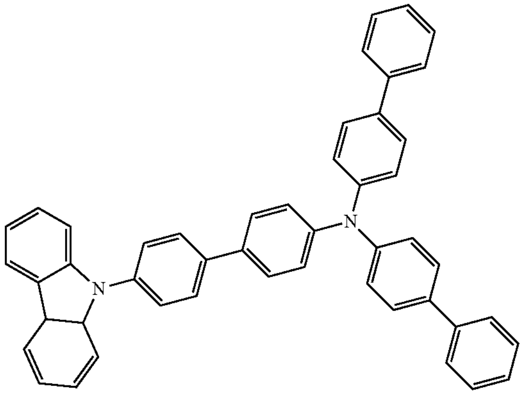

Formula 2-2

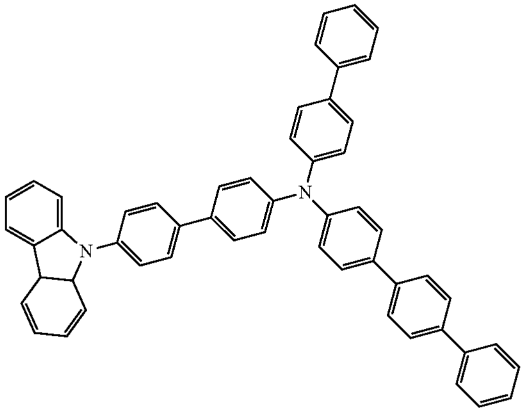

-continued

Formula 2-3

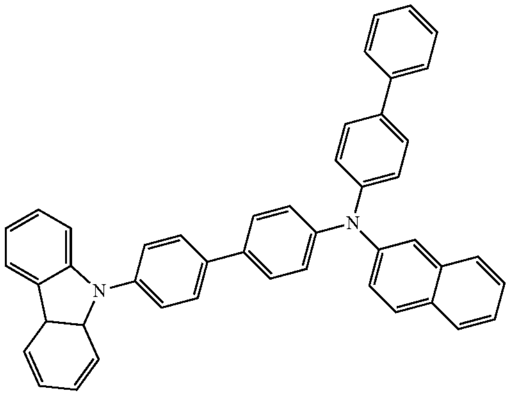

Formula 2-4

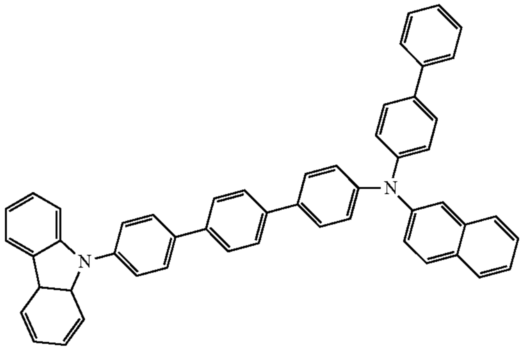

Formula 2-5

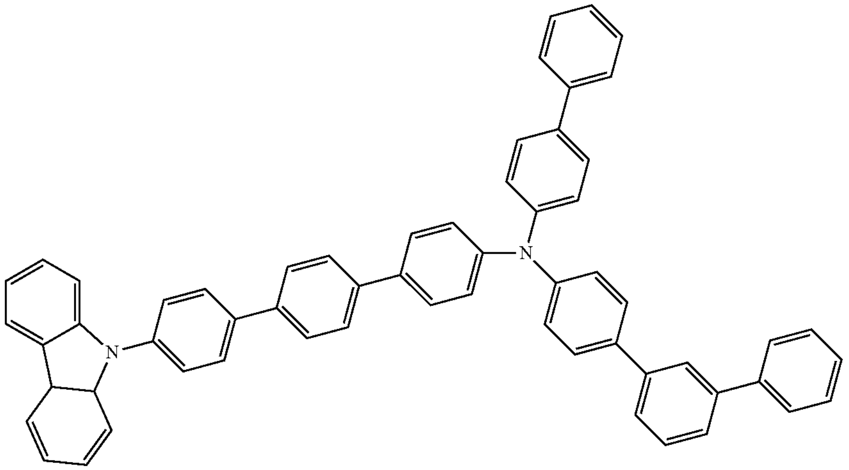

In an exemplary embodiment, a hole transport layer and an electron blocking layer may be made of other materials known to those skilled in the art that satisfy the above-mentioned energy level relationships, which is not limited hereto in the present disclosure.

Figure 9:
FIG. 9 is a schematic diagram of another OLED structure according to an exemplary embodiment of the present disclosure.

FIG. 9 is a schematic diagram of another OLED structure according to an exemplary embodiment of the present disclosure. As shown in FIG. 9, the OLED includes an anode 10, a cathode 90, and an organic emitting layer disposed between the anode 10 and the cathode 90. In an exemplary embodiment, the organic emitting layer may include a hole injection layer 20, a hole transport layer 30, an electron blocking layer 40, an emitting layer 50, a hole blocking layer 60, an electron transporting layer 70, and an electron injection layer 80 which are stacked. The hole injection layer 20, the hole transport layer 30 and the electron blocking layer 40 are disposed between the anode 10 and the emitting layer 50; the hole injection layer 20 is connected to the anode 10, and the electron blocking layer 40 is connected to the emitting layer 50; the hole transport layer 30 is disposed between the hole injection layer 20 and the electron blocking layer 40. The hole blocking layer 60, the electron transporting layer 70 and the electron injection layer 80 are disposed between the emitting layer 50 and the cathode 90; the hole blocking layer 60 is connected to the emitting layer 50; the electron injection layer 80 is connected to the cathode 90; and the electron transporting layer 70 is disposed between the hole blocking layer 60 and the electron injection layer 80. In an exemplary embodiment, the hole injection layer 20 is configured to lower a barrier for injecting holes from the anode, so that the holes may be efficiently injected into the emitting layer 50 from the anode. The hole transport layer 30 is configured to realize directional and orderly controlled migration of injected holes. The electron blocking layer 40 is configured to form a migration barrier for electrons and prevent electrons from migrating out of the emitting layer 50. The emitting layer 50 is configured to recombine electrons and holes to emit light. The hole blocking layer 60 is configured to form a migration barrier for holes and prevent holes from migrating out of the emitting layer 50. The electron transporting layer 70 is configured to realize directional and orderly controlled migration of injected electrons. The electron injection layer 80 is configured to lower barriers of electrons injected from the cathode, so that the electrons may be efficiently injected into the emitting layer 50 from the cathode.

In an exemplary embodiment, materials and structures of the hole blocking layer 30 and the electron blocking layer 40 are the same as or similar to those of the previous embodiments, which will not be repeatedly described here.

In an exemplary embodiment, the anode may be made of a material having a high work function. For the bottom emission type, the anode may be made of a transparent oxide material, such as indium tin oxide (ITO) or indium zinc oxide (IZO), and the thickness of the anode may be about 80 nm to 200 nm. For the top emission type, the anode may be made of a composite structure of metal and transparent oxide, such as Ag/ITO, Ag/IZO or ITO/Ag/ITO. The thickness of the metal layer in the anode may be about 80 nm to 100 nm, and the thickness of the transparent oxide in the anode may be about 5 nm to 20 nm, so that the average reflectivity of the anode in the visible region is about 85%-95%.

In an exemplary embodiment, for a top emission OLED, the cathode may be formed by an evaporation process using a metal material. The metal material may be magnesium (Mg), silver (Ag) or aluminum (Al), or alloy material such as an alloy of Mg:Ag, with a ratio of Mg:Ag being about 9:1 to 1:9. A thickness of the cathode may be about 10 nm to 20 nm so that average transmittance of the cathode at a wavelength of 530 nm is about 50%~60%. For the bottom emission OLED, the cathode may be made of magnesium (Mg), silver (Ag), aluminum (Al) or Mg:Ag alloy. The thickness of the cathode may be greater than about 80 nm, so that the cathode has good reflectivity.

In an exemplary embodiment, the hole injection layer may adopt inorganic oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may adopt P-type dopants with strong electron-withdrawing systems and dopants of hole transport materials, such as hexacyanohexaazatriphenylene, 2,3,5,6-Tetrafluoro-7,7',8,8'-tetracyanoquinodimethane (F4-TCNQ) or 1,2,3-tri[(cyano)(4-cyano-2,3,5,6-tetrafluorophenyl)methylene]cyclopropane, etc.

In an exemplary embodiment, a thickness of the hole injection layer may be about 5 nm to 20 nm.

In an exemplary embodiment, the emitting layer material may include one type of material, or may include two or more mixed materials. Emitting materials are classified into a blue emitting material, a green emitting material and a red emitting material. The blue emitting material may be selected from pyrene derivatives, anthracene derivatives, fluorene derivatives, perylene derivatives, styrylamine derivatives, metal complexes, etc. For example, N1,N6-bis([1,1'-biphenyl]-2-yl)-N1,N6-bis([1,1'-biphenyl]-4-yl) pyrene-1,6-bis diamine, 9,10-bis-(2-naphthyl)anthracene (ADN), 2-methyl-9,10-di-2-naphthylanthracene (MADN), 2,5,8,11-tetra-tert-butyl perylene (TBPe), 4,4'-bis[4-(diphenylamino)styryl]biphenyl (BDAV Bi), 4,4'-bis[4-(di-p-tolylamino)styryl] biphenyl (DPAVBi), bis(4,6-difluorophenylpyridine-C2,N) picolinoyl iridium (Flrpic). The green emitting material may be selected from, for example, coumarin dyes, copper quinacridinium derivatives, polycyclic aromatic hydrocarbons, diamine anthracene derivatives, carbazole derivatives, or metal complexes. For example, coumarin 6(C-6), coumarin 545T(C-525T), quinacridine copper (QA), N,N'-dimethyl quinacridone (DMQA), 5,12-diphenyl naphthalene (DPT), N10'-dinaphthalenyl-9,9'-bianthracene-10,10'-diamine (abbreviated as BA-NPB), tris (8-hydroxyquinoline) aluminum (III) (abbreviated as Alq3), tris (2-phenylpyridine) iridium (Ir(ppy)3), acetylacetonate bis (2-phenylpyridine) iridium (Ir(ppy)2(acac)). The red emitting material may be selected from DCM series materials or metal complexes. For example, 4-(dicyanomethylene)-2-methyl-6-(4-dimethylaminostyryl)-4H-pyran (DCM), 4-(dicyanomethylene)-2-tert-butyl-6-(1,1,7,7-tetramethyljulonidine-9-enyl)-4H-pyran (DCJTB), bis(1-phenylisoquinoline) (Acetylacetone) iridium(III) (Ir(piq)2(acac)), platinum octaethylporphyrin (PtOEP), bis(2-(2'-benzothienyl)pyridine-N,C3') (Acetyl acetone) iridium (abbreviated as Ir(btp)2 (acac), etc.

In an exemplary embodiment, the hole blocking layer and the electron transporting layer may use aromatic heterocyclic compounds, such as imidazole derivatives like benzimidazole derivatives, imidazopyridine derivatives, and benzimidazophenanthridine derivatives; oxazine derivatives like pyrimidine derivatives and triazine derivatives; compounds having a nitrogen-containing six-membered ring structure (also including compounds having a phosphine oxide-based substituent on the heterocyclic ring) such as quinoline derivatives, isoquinoline derivatives, phenanthroline derivatives, etc. For example, 2-(4-biphenyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenyl)-1,2,4-Triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP) or 4,4'-bis(5-methylbenzoxazol-2-yl)stilbene (BzOs), etc.

In an exemplary embodiment, a thickness of the hole blocking layer may be about 5 nm to 15 nm, and a thickness of the electron transporting layer may be about 20 nm to 50 nm.

In an exemplary embodiment, the electron injection layer may use alkali metals or metals such as lithium fluoride (LiF), ytterbium (Yb), magnesium (Mg) or Calcium (ca), or compounds of these alkali metals or metals.

In an exemplary embodiment, a thickness of the electron injection layer may be about 0.5 nm to 2 nm.

In an exemplary embodiment, the OLED may include an encapsulation layer, which may be encapsulated by a cover plate, or a thin film.

In an exemplary embodiment, for a top emission OLED, a thickness of an organic emitting layer between the cathode and the anode may be designed to meet optical path requirements of the optical microresonator, so as to obtain an optimal intensity and a color of an emitted light.

In an exemplary embodiment, the following preparation method may be used to prepare a display substrate including an OLED structure.

First, a drive circuit layer is formed on a base substrate through a patterning process, and a drive circuit layer of each sub-pixel may include a drive transistor and a storage capacitor constituting a pixel drive circuit.

Then, a planarization layer is formed on the base substrate on which the aforementioned structure is formed, and a via hole exposing a drain electrode of the drive transistor is formed on a planarization layer of each sub-pixel.

An anode is formed by a patterning process on the base substrate on which the aforementioned structure is formed, and an anode of each sub-pixel is connected to the drain electrode of the drive transistor through the via hole on the planarization layer.

Subsequently, a pixel define layer is formed by a patterning process on the base substrate on which the aforementioned structure is formed, a pixel opening exposing the anode is formed on the pixel define layer of each sub-pixel, and each pixel opening serves as an emitting region of each sub-pixel.

On the base substrate on which the aforementioned structure is formed, an open mask is used to evaporate a hole injection layer and a hole transport layer in sequence to form a common layer of the hole injection layer and the hole transport layer on the display substrate. That is, hole injection layers of all sub-pixels are communicated and hole transport layers of all sub-pixels are communicated. For example, areas of the hole injection layer and the hole transport layer are approximately the same, but thicknesses are different.

Subsequently, a fine metal mask is used to evaporate the electron blocking layer and a red emitting layer, the electron blocking layer and a green emitting layer, and the electron blocking layer and a blue emitting layer in different sub-pixels, and electron blocking layers and emitting layers of adjacent sub-pixels may overlap in a small portion (for example, an overlap portion accounts for less than 10% of an area of a pattern of a respective emitting layer), or may be isolated.

Then, an open mask is used to evaporate the hole blocking layer, the electron transporting layer, the electron injection layer and the cathode in sequence to form a common layer of the hole blocking layer, the electron transporting layer, the electron injection layer and the cathode on the display substrate. That is, hole blocking layers of all sub-pixels are communicated, electron transporting layers of all sub-pixels are communicated, and cathodes of all sub-pixels are communicated.

In an exemplary embodiment, a multi-source co-evaporation method may be adopted in an evaporated emitting layer to form an emitting layer containing a host material and a dopant material. A doping ratio may be adjusted by controlling an evaporation rate of the dopant material or by controlling an evaporation rate ratio of the host material to the dopant material during an evaporation process.

In an exemplary embodiment, orthographic projections of one or more of the hole injection layer, the hole transport layer, the hole blocking layer, the electron transporting layer, the electron injection layer, and the cathode on the base substrate is continuous. In some examples, a hole injection layer, a hole transport layer, a hole blocking layer, an electron transporting layer, and an electron injection layer of at least one row or column of sub-pixels is communicated to at least one layer in the cathode. In some examples, a hole injection layer, a hole transport layer, a hole blocking layer, an electron transporting layer, and an electron injection layer of a plurality of sub-pixels is communicated to at least one layer in the cathode.

In an exemplary embodiment, the organic emitting layer may include a microcavity adjusting layer located between the hole transport layer and the emitting layer. For example, after the hole transport layer is formed, a fine metal mask may be used to evaporate a red microcavity adjusting layer and the red emitting layer, a green microcavity adjusting layer and the green emitting layer, and a blue microcavity adjusting layer and the blue emitting layer in different sub-pixels. In an exemplary embodiment, the red microcavity adjusting layer, the green microcavity adjusting layer and the blue microcavity adjusting layer may include an electron blocking layer.

In an exemplary embodiment, since the hole blocking layer is a common layer and an emitting layers of different sub-pixels are isolated, an orthographic projection of the hole blocking layer on the substrate includes an orthographic projection of the emitting layer on the substrate, and an area of the hole blocking layer is larger than that of the emitting layer.

In an exemplary embodiment, since the hole blocking layer is a common layer, an orthographic projection of the hole blocking layer on the substrate at least includes orthographic projections of emitting regions of two sub-pixels on base substrate.

In an exemplary embodiment, an orthographic projection of at least part of emitting layers of sub-pixels on base substrate overlaps an orthographic projection of a drive transistor of a pixel drive circuit on base substrate.

Table 1 to Table 3 are performance comparison results of several film material combination structures according to an exemplary embodiment of the present disclosure. In a comparative experiment, structures of organic emitting layers of comparative structures and structures 1 to 8 are all HIL/HTL/EBL/EML/HBL/ETL/EIL, with a same thickness. Materials of a hole injection layer HIL, an emitting layer EML, a hole blocking layer HBL, an electron transporting layer ETL and a hole injection layer EML are the same. LT95 in the Table indicates the time for OLED to decrease from initial brightness (100%) to 95%. Since the life curve follows the multi-exponential decay model, the life of OLED may be estimated according to LT95.

Related materials of films with the same material in the comparative structure and the structure 1 to the structure 8 are as follows:

| Project | Material |
|---|---|
| Hole Injection Layer HIL | 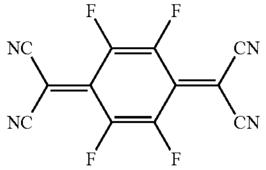 [SMILES: N#CC(C#N)=c1c(F)c(F)c(=C(C#N)C#N)c(F)c1F] |
| Host Material in Emitting Layer | 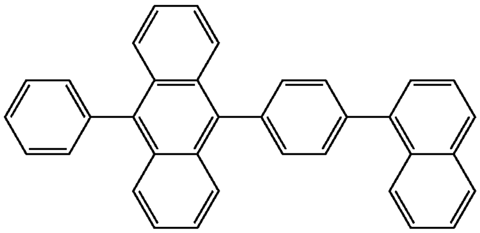 [SMILES: c1ccc(-c2c3ccccc3c(-c3ccc(-c4cccc5ccccc45)cc3)c3ccccc23)cc1] |

-continued
| Project | Material |
| --- | --- |
| Dopant Material in Emitting Layer | 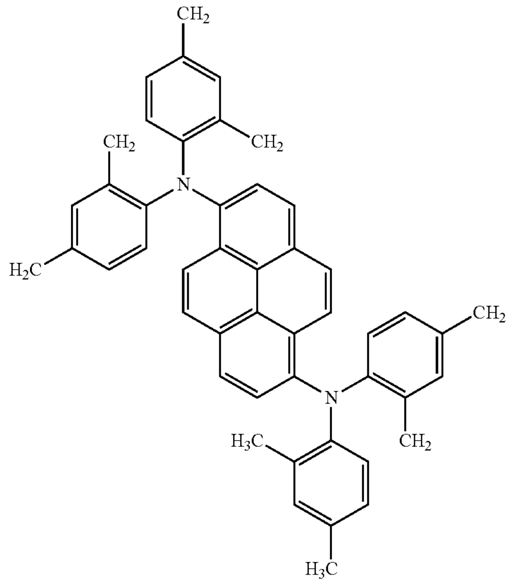 |
| Hole blocking layer HBL | 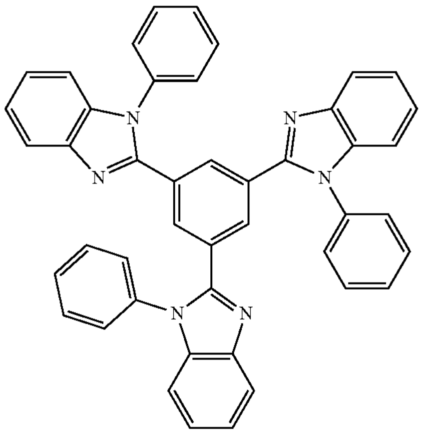 [SMILES: c1ccc(-n2c(-c3cc(-c4nc5ccccc5n4-c4ccccc4)cc(-c4nc5ccccc5n4-c4ccccc4)c3)nc3ccccc32)cc1] |
| Electron transporting layer ETL | 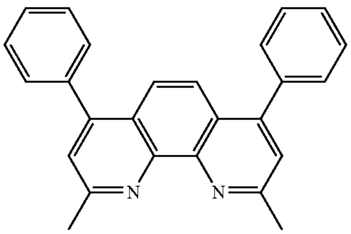 [SMILES: Cc1cc(-c2ccccc2)c2ccc3c(-c4ccccc4)cc(C)nc3c2n1] |
| Hole Injection Layer EIL | Metal |

Table 1 is performance comparison results of different EBL materials in an exemplary embodiment of the present disclosure. In the comparative experiment, materials of the hole transport layer HTL of the comparative structure and the structure 1 to the structure 2 are the same, and materials of the electron blocking layer EBL are different. The materials of the hole transport layer HTL and the electron blocking layer EBL of the comparative structure and the structure 1 to the structure 2 are as follows:

| | Hole Transport Layer HTL | Electron blocking layer EBL |
|---|---|---|
| Comparative Structure | 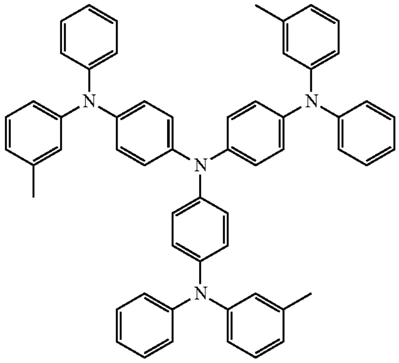 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1] | 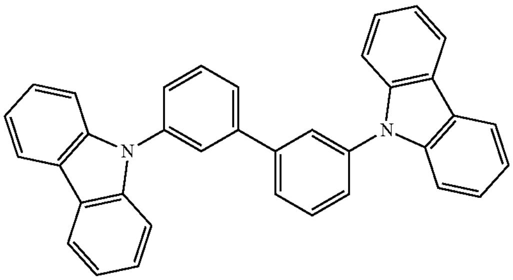 [SMILES: c1cc(-c2cccc(-n3c4ccccc4c4ccccc43)c2)cc(-n2c3ccccc3c3ccccc32)c1] |
| Structure 1 | | 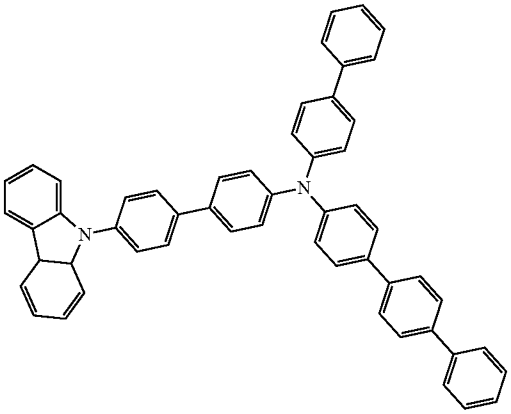 Formula 2-2 |
| Structure 2 | | 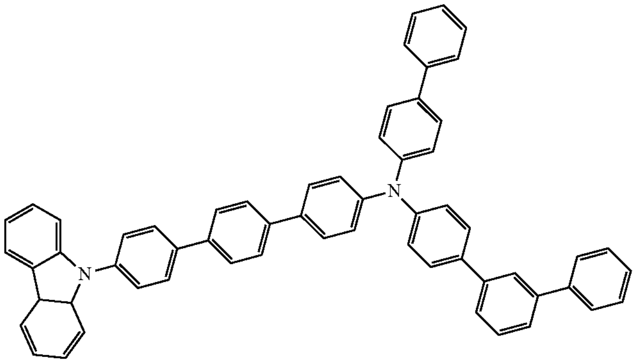 Formula 2-5 |

TABLE 1

| Performance comparison results of different EBL materials | | | |
|---|---|---|---|
| | Voltage | Efficiency | Service Life (LT95@10000nit) |
| Comparative Structure | 100% | 100% | 100% |
| Structure 1 | 100% | 105% | 136% |
| Structure 2 | 98% | 112% | 129% |

As shown in Table 1, compared with the comparative structure, both the structure 1 and the structure 2 have a significant improvement in efficiency and service life. Therefore, the exemplary embodiment of the present disclosure adopts an energy level collocation of the hole transport layer and the electron blocking layer and a combination of different electron blocking layer materials, so that the service life and efficiency are greatly improved.

Table 2 is performance comparison results of different HTL materials in an exemplary embodiment of the present disclosure. In the comparative experiment, materials of the electron blocking layer EBL of the comparative structure and the structure 3 to the structure 4 are the same, and materials of the hole transport layer HTL are different. The materials of the hole transport layer HTL and the electron blocking layer EBL of the comparative structure and the structure 3 to the structure 4 are as follows:

| | Hole Transport Layer HTL | Electron blocking layer EBL |
|---|---|---|
| Comparative Structure | 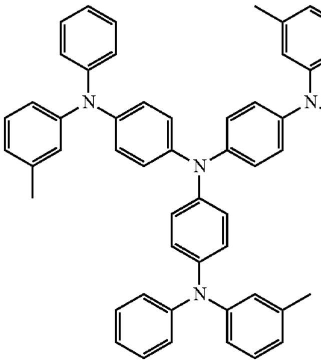 | 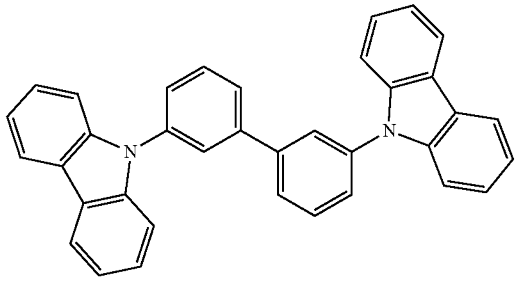 [SMILES: c1cc(-c2cccc(-n3c4ccccc4c4ccccc43)c2)cc(-n2c3ccccc3c3ccccc32)c1] |
| Structure 3 | 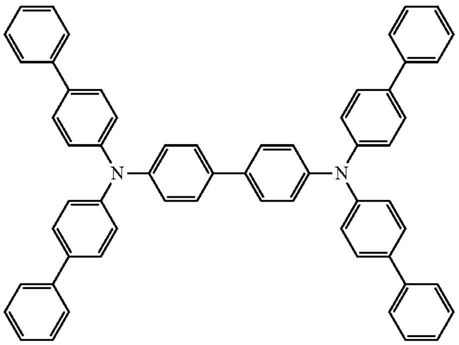 Formula 1-1 | |
| Structure 4 | 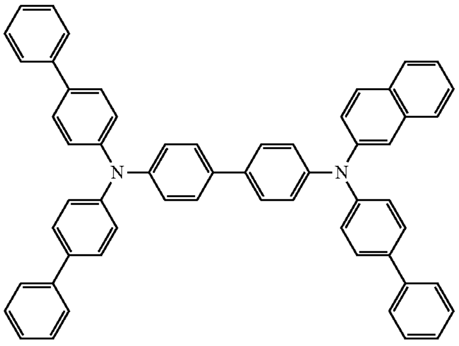 Formula 1-4 | |

TABLE 2

| Performance comparison results of different HTL materials | | | |
|---|---|---|---|
| | Voltage | Efficiency | Service Life (LT95@10000nit) |
| Comparative Structure | 100% | 100% | 100% |
| Structure 3 | 99% | 108% | 127% |
| Structure 4 | 98% | 113% | 131% |

As shown in Table 2, compared with the comparative structure, both the structure 3 and the structure 4 have a significant improvement in efficiency and service life. Therefore, the exemplary embodiment of the present disclosure adopts an energy level collocation of the hole transport layer and the electron blocking layer and a combination of different hole transport layer materials, so that the service life and efficiency are greatly improved.

Table 3 is performance comparison results of different HTL and EBL materials in an exemplary embodiment of the present disclosure. In the comparative experiment, materials of the electron blocking layer EBL of the comparative structure and the structure 5 to the structure 8 are different, and materials of the hole transport layer HTL are different. The materials of the hole transport layer HTL and the electron blocking layer EBL of the comparative structure and the structure 5 to the structure 8 are as follows:

| | Hole Transport Layer HTL | Electron blocking layer EBL |
|---|---|---|
| Comparative Structure | 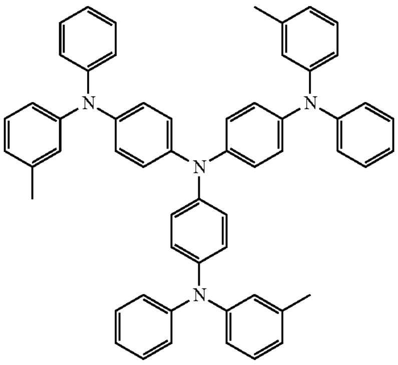 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1] | 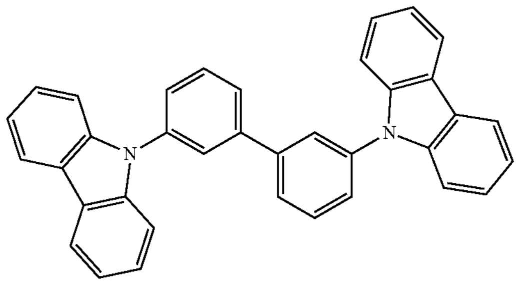 [SMILES: c1cc(-c2cccc(-n3c4ccccc4c4ccccc43)c2)cc(-n2c3ccccc3c3ccccc32)c1] |
| Structure 5 | 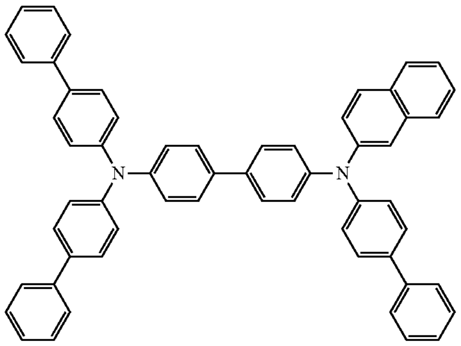 Formula 1-4 | 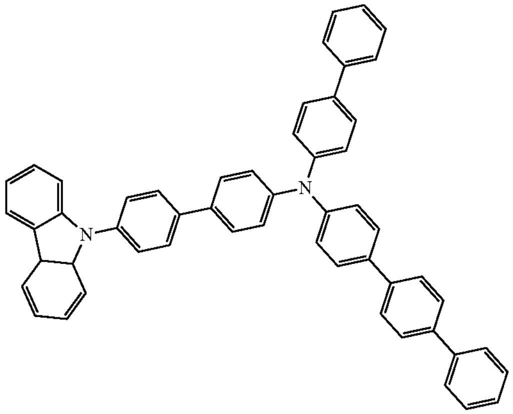 Formula 2-2 |
| Structure 6 | 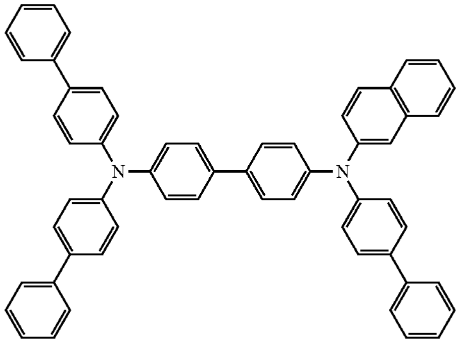 Formula 1-4 | 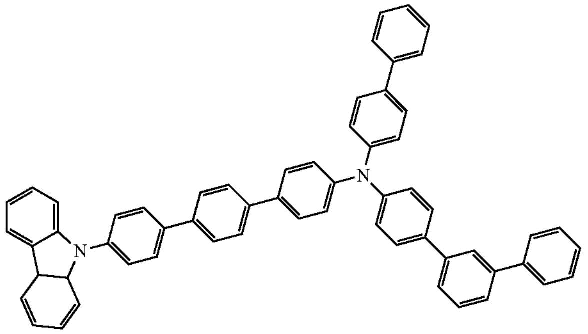 Formula 2-5 |

-continued

| | Hole Transport Layer HTL | Electron blocking layer EBL |
|---|---|---|
| Structure 7 | 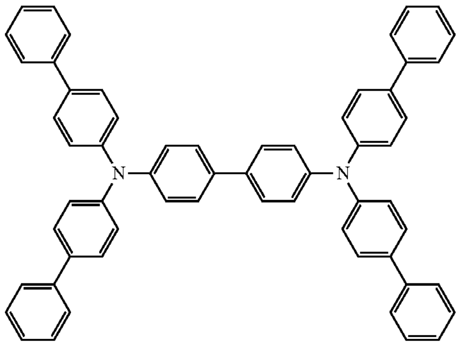 Formula 1-1 | 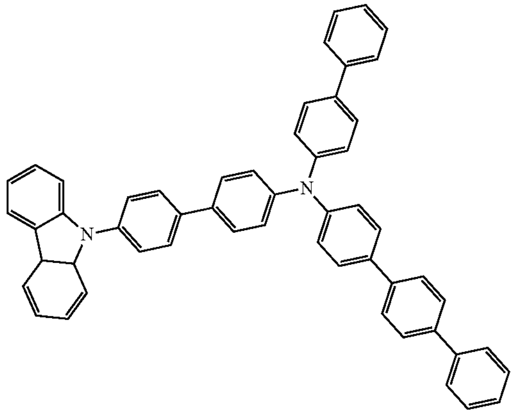 Formula 2-2 |
| Structure 8 | 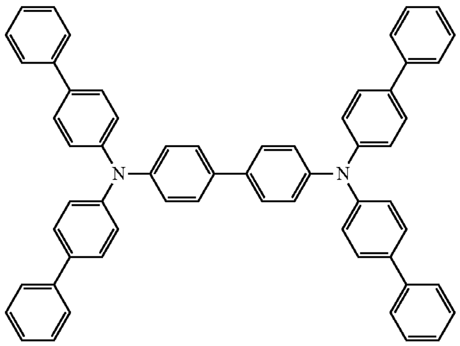 Formula 1-1 | 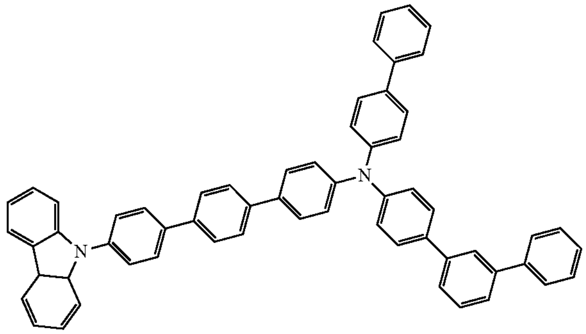 Formula 2-5 |

TABLE 3

Performance comparison results of different HTL and EBL materials

| | Voltage | Efficiency | Service Life (LT95@10000nit) |
|---|---|---|---|
| Comparative Structure | 100% | 100% | 100% |
| Structure 5 | 98% | 115% | 141% |
| Structure 6 | 97% | 119% | 137% |
| Structure 7 | 99% | 109% | 126% |
| Structure 8 | 97% | 114% | 120% |

As shown in Table 3, compared with the comparative structure, the structure 5 to the structure 8 have a significant improvement in efficiency and service life. Therefore, the exemplary embodiment of the present disclosure adopts an energy level collocation of the hole transport layer and the electron blocking layer and a combination of different materials the hole transport layer and the electron blocking layer, so that the service life and efficiency are greatly improved.

According to the exemplary embodiment of the present disclosure, by reasonably matching an energy level relationship, mobility relationship, or a relationship between an energy level and mobility of the hole transport layer, the electron blocking layer, and the host and dopant materials of the emitting layer, the interface is optimized from the energy level matching structure, which is beneficial to carrier transmission into the emitting layer, a reduction in a carrier accumulation at an interface, an increase in hole concentration in the emitting layer from the mobility relationship, making the exciton recombination region move toward a center of the emitting layer, and away from the electron blocking layer. In this way, an electron accumulation at the surface between the emitting layer and the electron blocking layer is reduced, and the damage to the electron blocking layer is decreased. According to the exemplary embodiment of the present disclosure, by disposing a material combination of the electron blocking layer and the hole blocking layer, and simultaneously adopting compounds with high hole mobility on the hole blocking layer and the electron blocking layer, a hole transmission rate is increased from a perspective of a material. In this way, the damage of the electron blocking layer is reduced while the accumulation of interface charges is reduced, so that the material stability of the electron blocking layer is improved, the material degradation and performance degradation caused by electron accumulation are reduced, the service life of the device is prolonged, and the luminance efficiency is improved.

The present disclosure further provides a display apparatus including the aforementioned organic light emitting device. The display apparatus may be any product or component with a display function such as a mobile phone, a tablet computer, a television, a display, a laptop, a digital photo frame, a navigator, a vehicle-mounted display, a smart watch, a smart band, etc.

Although the embodiments disclosed in the present disclosure are as described above, the described contents are only the embodiments for facilitating understanding of the present disclosure, which are not intended to limit the present disclosure. Any person skilled in the field to which the present application pertains can make any modifications and variations in the forms and details of implementation without departing from the spirit and the scope disclosed in the present application, but the patent protection scope of the present application should still be subject to the scope defined by the appended claims.

What is claimed is:

1. An organic light emitting device, comprising an anode, a cathode, and an emitting layer disposed between the anode and the cathode; wherein a hole transport layer and an electron blocking layer are disposed between the anode and the emitting layer; the hole transport layer and the electron blocking layer satisfy:

$$|HOMO_{HTL}-HOMO_{EBL}|\leq 0.2\ eV$$

wherein $HOMO_{HTL}$ is a highest occupied molecular orbital, HOMO energy level of the hole transport layer and $HOMO_{EBL}$ is a HOMO energy level of the electron blocking layer;

wherein a material of the hole transport layer comprises a compound having the following structural formula:

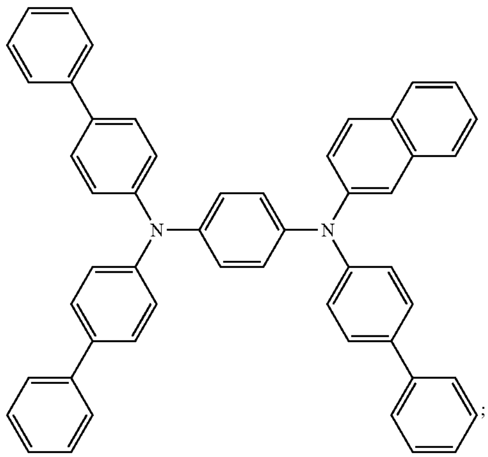
;

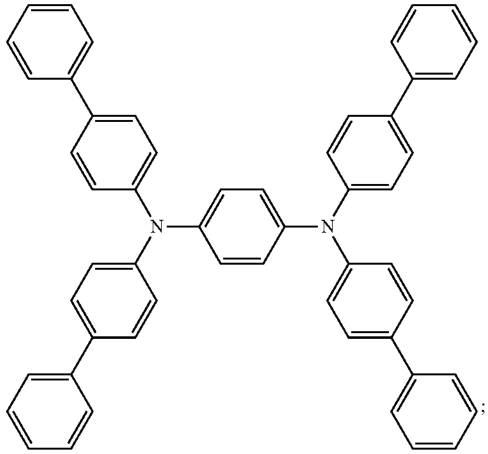
;

wherein a material of the electron blocking layer comprises one or more compounds having the following structural formulas:

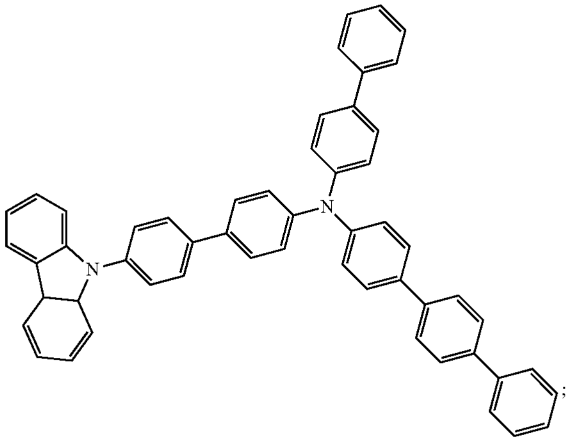
;

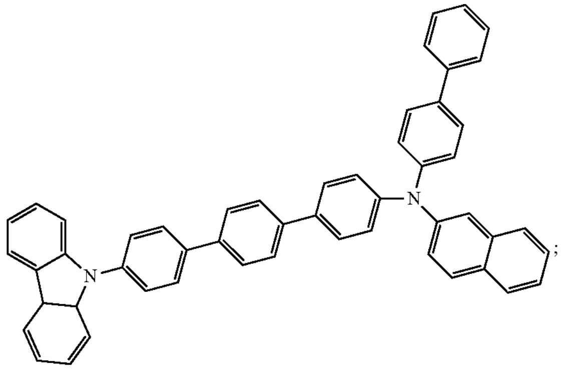
;

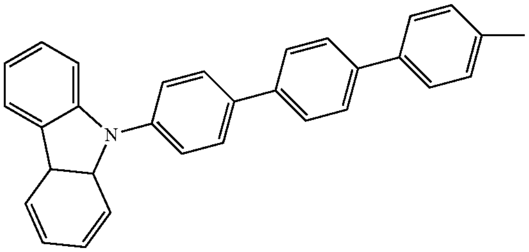

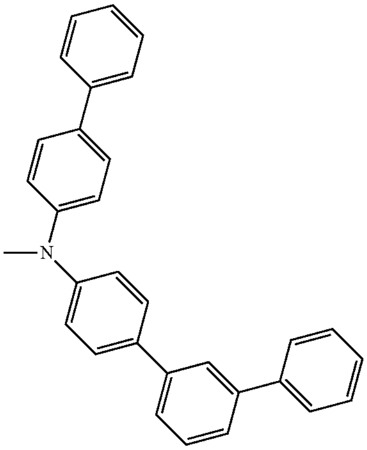
;

wherein the emitting layer comprises a host material and a dopant material doped in the host material; the electron blocking layer and the dopant material satisfy:

$$HOMO_{dopant}>HOMO_{EBL}$$

wherein $HOMO_{dopant}$ is a HOMO energy level of the dopant material;

the dopant material comprises a compound having the following structural formula:

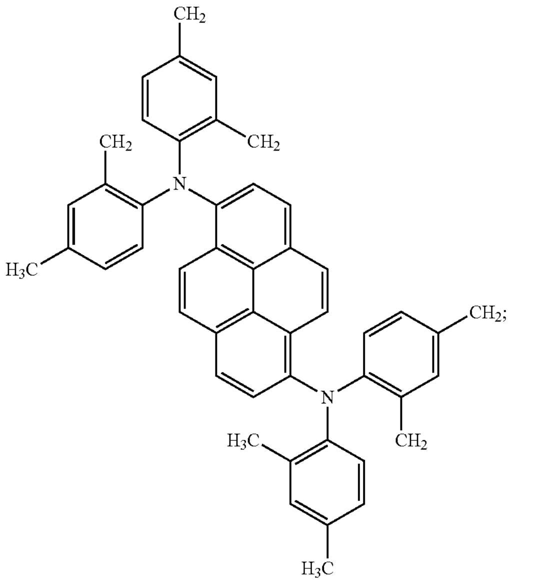

the host material comprises a compound having the following structural formula:

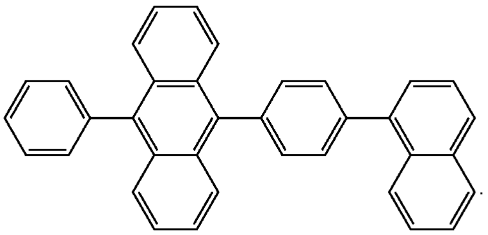 [SMILES: c1ccc(-c2c3ccccc3c(-c3ccc(-c4cccc5ccccc45)cc3)c3ccccc23)cc1]

2. The organic light emitting device of claim 1, wherein the electron blocking layer and the dopant material satisfy:

$$|LUMO_{EBL}-LUMO_{dopant}|>0.1\ eV$$

wherein $LUMO_{EBL}$ is a lowest unoccupied molecular orbital, LUMO energy level of the hole transport layer and $LUMO_{dopant}$ is a LUMO energy level of the dopant material.

3. The organic light emitting device of claim 1, wherein the electron blocking layer and the host material satisfy:

$$LUMO_{EBL}-LUMO_{host}>0.4\ eV$$

wherein $LUMO_{EBL}$ is a lowest unoccupied molecular orbital, LUMO energy level of the hole transport layer and $LUMO_{host}$ is a LUMO energy level of the host material.

4. The organic light emitting device of claim 1, wherein the host material and the dopant material satisfy:

$$LUMO_{dopant}<LUMO_{host}$$

wherein LUMO dopant is the LUMO energy level of the dopant material, and $LUMO_{host}$ is the LUMO energy level of the host material.

5. The organic light emitting device of claim 1, wherein hole mobility of the hole transport layer is greater than 10 times that of the electron blocking layer.

6. The organic light emitting device of claim 5, wherein the hole mobility of the hole transport layer is $10^{-2}$ $cm^2/Vs$ to $10^{-6}$ $cm^2/Vs$, and the hole mobility of the electron blocking layer is $10^{-4}$ $cm^2/Vs$ to $10^{-6}$ $cm^2/Vs$.

7. The organic light emitting device of claim 1, wherein the hole mobility of the electron blocking layer is greater than 100 times that of the host material.

8. The organic light emitting device of claim 1, wherein electron mobility of the host material is greater than the hole mobility of the host material.

9. The organic electroluminescent device of claim 1, wherein the hole mobility of the host material is $10^{-9}$ $cm^2/Vs$ to $10^{-10}$ $cm^2/Vs$; the electron mobility of the host material is $10^{-6}$ $cm^2/Vs$ to $10^{-8}$ $cm^2/Vs$; electron mobility of the dopant material is $10^{-8}$ $cm^2/Vs$ to $10^{-10}$ $cm^2/Vs$; electron mobility of the hole transport layer is less than $10^{-8}$ $cm^2/Vs$; and electron mobility of the electron blocking layer is less than $10^{-8}$ $cm^2/Vs$.

10. The organic light emitting device of claim 1, wherein a lowest triplet energy of the electron blocking layer is greater than 2.3 eV.

11. A display apparatus comprising the organic light emitting device according to claim 1.

* * * * *